(12) United States Patent
Moon

(10) Patent No.: US 8,400,189 B2
(45) Date of Patent: Mar. 19, 2013

(54) VOLTAGE DETECTION DEVICE AND SEMICONDUCTOR DEVICE INCLUDING THE SAME

(75) Inventor: Byong-mo Moon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/238,764

(22) Filed: Sep. 21, 2011

(65) Prior Publication Data

US 2012/0105107 A1    May 3, 2012

(30) Foreign Application Priority Data

Nov. 2, 2010  (KR) .......................... 10-2010-0108405

(51) Int. Cl.
    *H03K 5/22* (2006.01)
(52) U.S. Cl. ....................................................... 327/77
(58) Field of Classification Search ................. 327/77
    See application file for complete search history.

(56) References Cited

U.S. PATENT DOCUMENTS

| | | | |
|---|---|---|---|
| 3,970,925 A * | 7/1976 | Procter et al. ................. 324/649 |
| 5,769,873 A * | 6/1998 | Zadeh ............................. 607/29 |
| 6,029,055 A * | 2/2000 | Nobusawa ..................... 455/259 |
| 6,111,533 A * | 8/2000 | Yuan et al. ..................... 341/157 |
| 6,133,797 A * | 10/2000 | Lovelace et al. ................ 331/17 |
| 6,580,251 B2 * | 6/2003 | Takeuchi ...................... 320/138 |
| 6,704,383 B2 * | 3/2004 | Lee et al. ...................... 375/376 |
| 6,806,698 B2 * | 10/2004 | Gauthier et al. ........... 324/76.41 |
| 7,250,807 B1 * | 7/2007 | Doyle ............................ 327/534 |
| 2001/0006356 A1 * | 7/2001 | Norskov et al. ................. 331/34 |
| 2003/0164720 A1 * | 9/2003 | Self ................................. 327/77 |

FOREIGN PATENT DOCUMENTS

| | | |
|---|---|---|
| JP | 2009-201183 A | 9/2009 |
| KR | 10-2010-0030375 A | 3/2010 |
| KR | 10-2010-0050916 A | 5/2010 |

* cited by examiner

*Primary Examiner* — Lincoln Donovan
*Assistant Examiner* — William Hernandez
(74) *Attorney, Agent, or Firm* — Sughrue Mion, PLLC

(57) ABSTRACT

A voltage detection device and a semiconductor device including the same are provided. The voltage detection device includes: a first clock generator which generates a first clock signal having a period that changes according to an external voltage; a second clock generator which generates a second clock signal having a predetermined period corresponding to a reference voltage; and a detector which detects a change of the external voltage by comparing the first clock signal with the second clock signal.

18 Claims, 17 Drawing Sheets

100

VOLTAGE DETECTION DEVICE AND SEMICONDUCTOR DEVICE INCLUDING THE SAME

CROSS-REFERENCE TO RELATED APPLICATION

This application claims priority from Korean Patent Application No. 10-2010-0108405, filed on Nov. 2, 2010 in the Korean Intellectual Property Office, the disclosure of which is incorporated herein in its entirety by reference.

BACKGROUND

Methods and apparatuses consistent with exemplary embodiments relate to a voltage detection device, and more particularly, to a voltage detection device for detecting a level of an external voltage and a semiconductor device including the same.

Along with the development of industrial and multimedia applications, semiconductor devices used in computers and mobile devices have become highly integrated and efficient. One example in this regard is a memory device with increased capacity and speed. Also, various attempts have been made to further increase the memory capacity and operation speed of a semiconductor device.

Besides the high integration and performance of a semiconductor device, a level of an operating voltage for driving the semiconductor device has become lower. Therefore, when a semiconductor device operates with a low-level operating voltage, less power is consumed. The need for a low-power consuming semiconductor device has increased especially in relation to mobile devices. However, a semiconductor device using a low-level operating voltage is sensitive to a level change of a voltage signal provided from the outside. For example, as a level of an external voltage applied to a memory device is changed, a data transfer rate is changed, and thus, an external controller may less likely receive data effectively.

SUMMARY

One or more exemplary embodiments provide a voltage detection device and a semiconductor device including the same.

According to an aspect of an exemplary embodiment, there is provided a voltage detection device including: a first clock generator generating a first clock signal having a period that changes according to an external voltage; a second clock generator generating a second clock signal having a predetermined period corresponding to a reference voltage; and a detector detecting a change of the external voltage by comparing the first clock signal with the second clock signal.

According to another aspect of another exemplary embodiment, there is provided a semiconductor device including: a first clock generator generating a first clock signal having a period that changes according to an external voltage; a second clock generator generating a second clock signal having a predetermined period corresponding to a reference voltage; a detector detecting a change of the external voltage by comparing the first clock signal with the second clock signal; and an output driver having a driver strength adjusted according to a detection result of the detector.

BRIEF DESCRIPTION OF THE DRAWINGS

The above and/or other aspects of the present disclosure will be more clearly understood from the following detailed description taken in conjunction with the accompanying drawings in which.

DETAILED DESCRIPTION OF THE EMBODIMENTS

Figure 1:
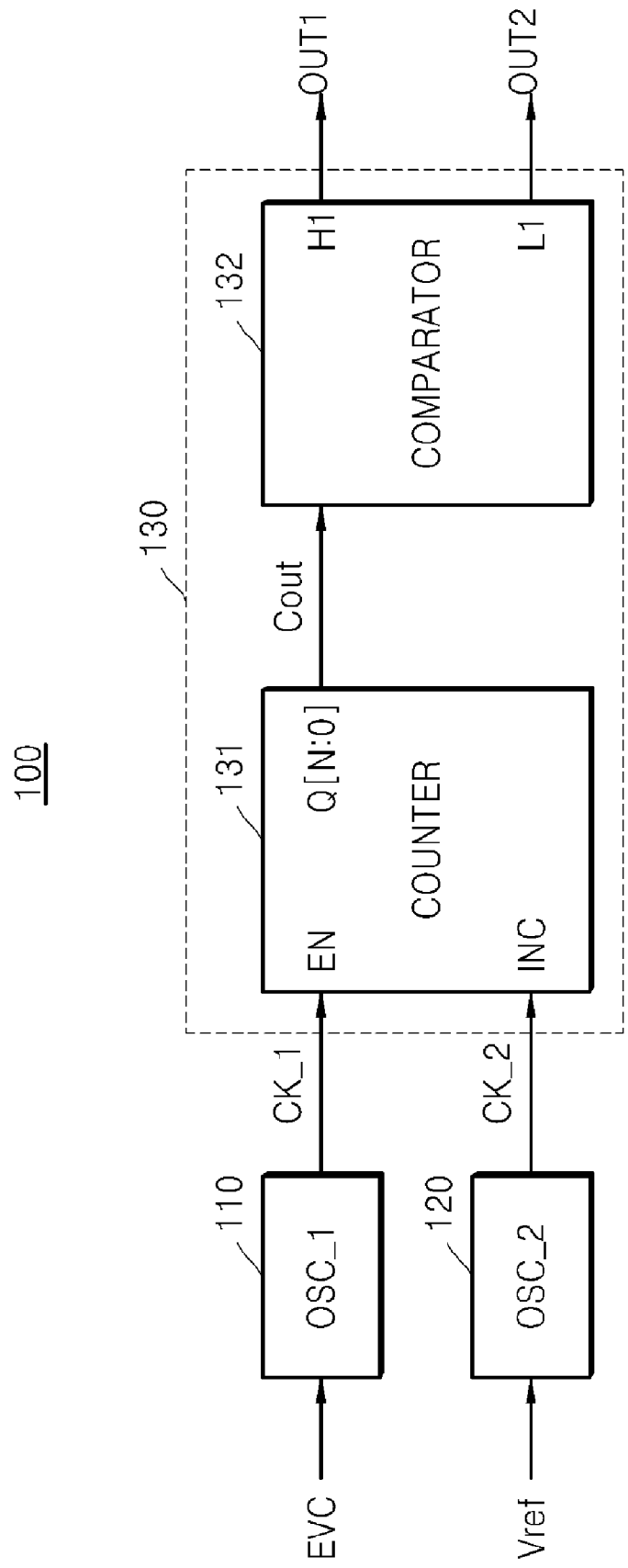
FIG. 1 is a block diagram illustrating a voltage detection device according to an embodiment.

The attached drawings for illustrating exemplary embodiments of the inventive concept are referred to in order to gain a sufficient understanding of the inventive concept, the merits thereof, and the objectives accomplished by the implementation of the inventive concept.

Hereinafter, the inventive concept will be described in detail by explaining exemplary embodiments of the inventive concept with reference to the attached drawings. Like reference numerals in the drawings denote like elements.

FIG. 1 is a block diagram illustrating a voltage detection device according to an exemplary embodiment. As shown in FIG. 1, the voltage detection device 100 may include a first clock generator 110, a second clock generator 120, and a detector 130. The first clock generator 110 receives an external voltage EVC and generates a first clock signal CK_1 having a period that changes according to the external voltage EVC. The second clock generator 120 receives a reference voltage Vref and generates a second clock signal CK_2 having a fixed period (or a predetermined period) corresponding to the reference voltage Vref. The first clock generator 110 or the second clock generator 120 may be realized with a device for generating an oscillation signal. For example, the first clock generator 110 or the second clock generator 120 may be realized with a ring oscillator including at least one inverter or at least one differential amplifier. The first clock generator 110 generates the first clock signal CK_1 having a period varying according to a change (for example, a level change) of the external voltage EVC. The second clock generator 120 generates the second clock signal CK_2 having a fixed period corresponding to a level of the reference voltage Vref.

The detector 130 receives the first clock signal CK_1 and detects a level change of the external voltage EVC by using the received first clock signal CK_1. Additionally, the detector 130 further receives the second clock signal CK_2 as a reference clock and generates a signal changed according to the periods of the first clock signal CK_1 and the second clock signal CK_2 so as to output a result obtained by detecting a change of the external voltage EVC. The reference voltage Vref is a constant voltage signal generated and provided to the voltage detection device 100. For example, if the voltage detection device 100 is built in a DRAM semiconductor device, a reference voltage for an array, which is used for generating a voltage provided to a DRAM cell, may be provided as the reference voltage Vref to the voltage detection device 100.

The detector 130 may include a counter 131 and a comparator 132. The counter 131 receives the first clock signal CK_1 and the second clock signal CK_2. Additionally, the counter 131 may include a first input terminal EN and a second input terminal INC. The first clock signal CK_1 is provided to the first input terminal EN and the second clock signal CK_2 is provided to the second input terminal INC. Additionally, the counter 131 is enabled during a first state (for example, logic high) of the first clock signal CK_1 and counts the edges of the second clock signal CK_2 provided to the second input terminal INC during an enable interval. The counter 131 counts the clocks of the second clock signal CK_2 to generate a counting signal Cout. Then, the counting signal Cout is provided to the comparator 132 through an output terminal Q[N:0] of the counter 131.

As mentioned above, the reference voltage Vref is a constant voltage signal regardless of a change of the external voltage EVC. Accordingly, the second clock generator 120 generates the second clock signal CK_2 having a fixed period by using the reference voltage Vref. Meanwhile, the first clock generator 110 generates the first clock signal CK_1 having a period that changes according to a level change of the external voltage EVC. For example, as a level of the external voltage EVC increases, a period of the first clock signal CK_1 decreases gradually. On the contrary, as a level of the external voltage EVC decreases, a period of the first clock signal CK_1 increases gradually.

The counter 131 counts the edges of the second clock signal CK_2 during the first state of the first clock signal CK_1 to generate the counting signal Cout. Additionally, the counter 131 resets a counting value when the first clock signal CK_1 is changed into a second state and performs a counting operation when the first clock signal CK_1 is changed into the first state again. The counting signal Cout may be a digital signal having predetermined bits. For example, as shown in FIG. 1, a signal having N+1 bits may be outputted as the counting signal Cout.

When a level of the external voltage EVC increases, an interval having the first state of the first clock signal CK_1 decreases, and accordingly, a counting signal Cout having a relatively small value is generated. On the contrary, when a level of the external voltage EVC decreases, an interval having the first state of the first clock signal CK_1 increases, and accordingly, a counting signal Cout having a relatively large value is generated. The comparator 132 receives the counting signal Cout and compares the received counting signal Cout with a predetermined reference value (not shown) stored in the comparator 132, thereby outputting a comparison result as detection signals Out1 and Out2. The reference value of the comparator 132 may be a value corresponding to when the external voltage EVC is a predetermined normal voltage level. The comparator 132 outputs a result obtained by comparing the external voltage EVC with the normal voltage level. For example, in a case that the normal voltage level is 1.0 V, the first detection signal Out1 is outputted if it is detected that a level of the external voltage EVC is greater than 1.0 V. Also, the second detection signal Out2 is outputted if it is detected that a level of the external voltage EVC is less than 1.0 V. Moreover, as a level of the external voltage EVC increases, a value of the counting signal Cout becomes smaller, so that the first detection signal Out1 may be outputted if the counting signal Cout is less than the reference value.

The voltage detection device 100 generates the detection signals Out1 and Out2, which are generated by digitizing a result obtained by detecting a change of the external voltage EVC and have respectively different values according to a change of the external voltage EVC. For example, since the first clock signal CK_1 having respectively different counting values according to a change of the external voltage EVC is generated, a counting signal Cout having respectively different counting values according to each change of the external voltage EVC is generated. The detection signals Out1 and Out2 according to a change of the external voltage EVC are generated by detecting a difference between the reference value and the counting signal Cout of a digital value.

Figure 2:
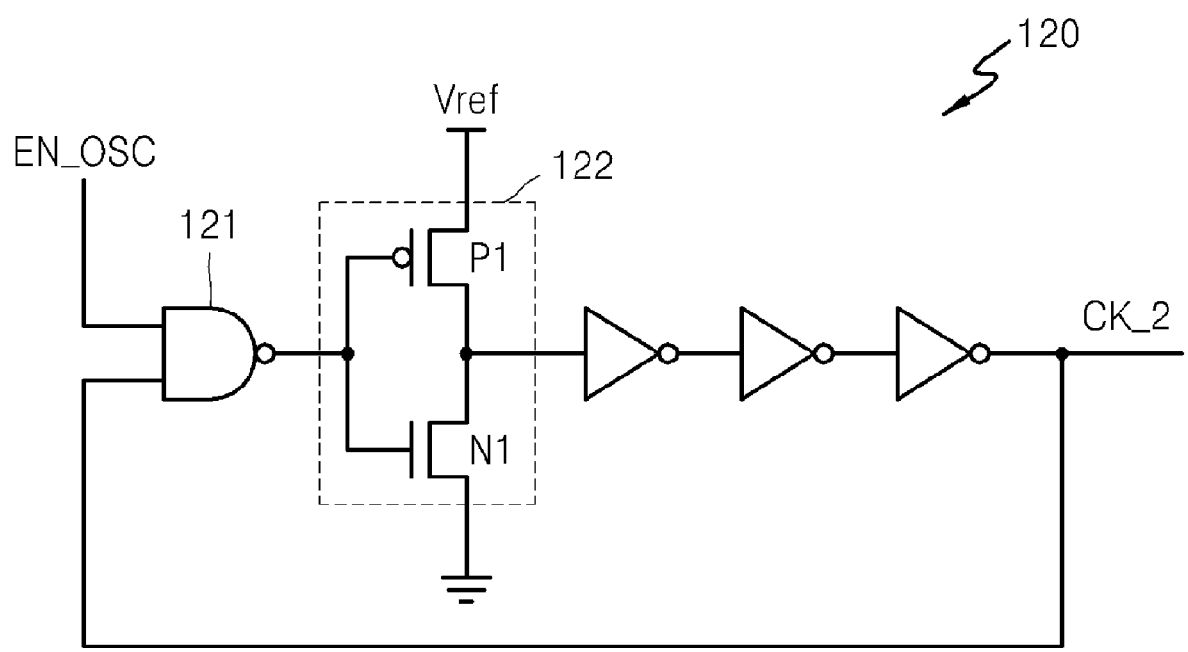
FIG. 2 is a circuit diagram illustrating the second clock generator of FIG. 2 according to an embodiment.

FIG. 2 is a circuit diagram illustrating the second clock generator of FIG. 2 according to an exemplary embodiment. The second clock generator 120 of FIG. 1 may have a circuit diagram as shown in FIG. 2, and also, the first clock generator 110 of FIG. 1 may have a circuit diagram identical or similar to that of the second clock generator 120 of FIG. 2.

As shown in FIG. 2, the second clock generator 120 includes a ring oscillator. The ring oscillator may include a plurality of gates 121 and 122 connected in a ring form. As one example, the plurality of gates 121 and 122 may include one NAND gate 121 and a plurality of inverters 122. The NAND gate 121 may receive an enable signal EN_OSC for enabling the second clock generator 120. An output of a gate in a previous stage is inputted to a gate in the next stage and an output of the last inverter is provided as an input of an inverter (or a NAND gate) in a first stage. The reference voltage Vref is provided to each of the gates 121 and 122 and the second clock generator 120 generates a second clock signal CK_2 having a predetermined frequency that oscillates due to the reference voltage Vref. For example, through the above inversion operation and feedback configuration, an oscillation signal changed from logic low into logic high is generated in an inverter stage and the generated oscillation signal is provided as the second clock signal CK_2 to the outside.

Figure 3:
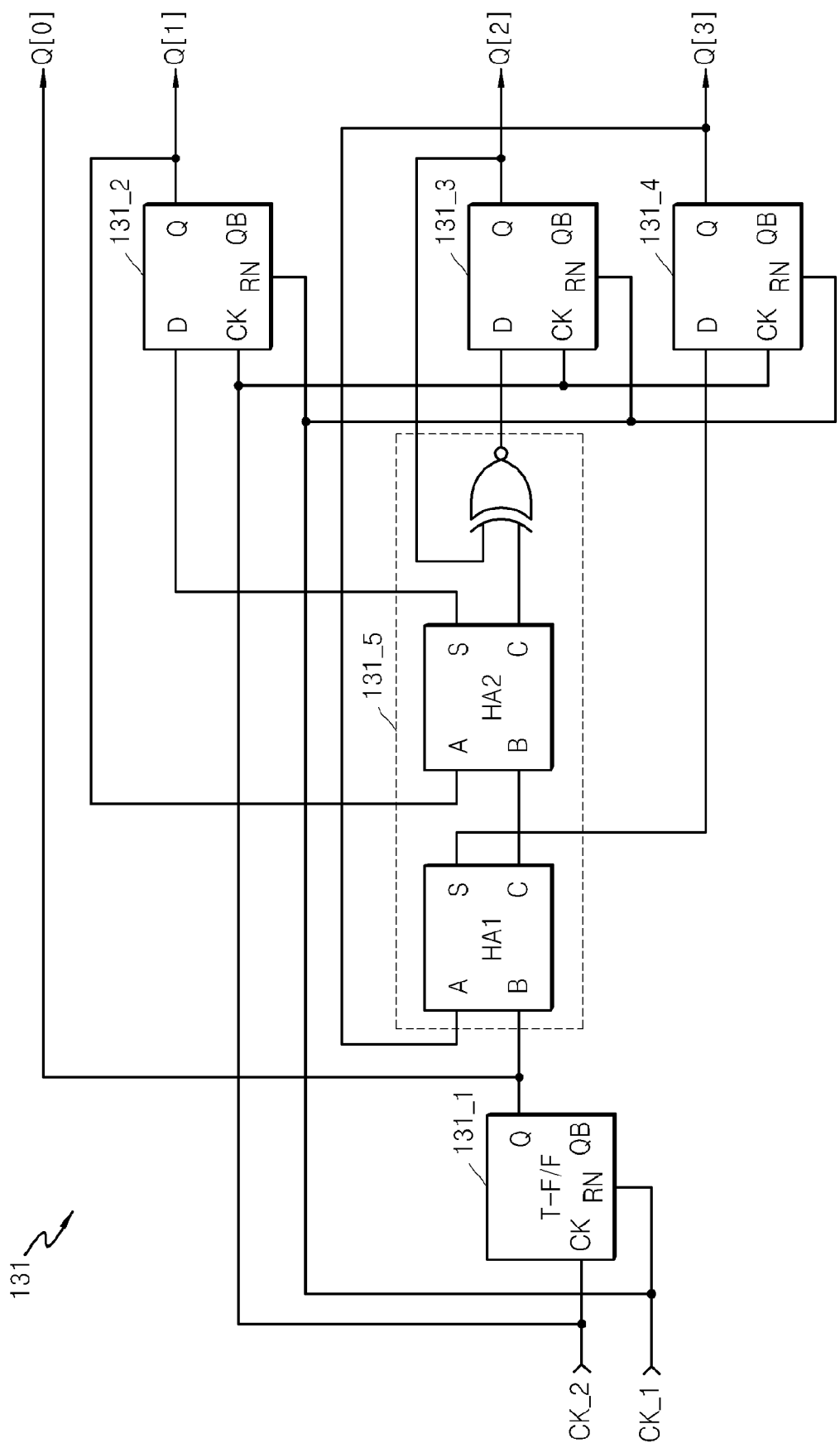
FIG. 3 is a circuit diagram illustrating the counter of FIG. 1.

FIG. 3 is a circuit diagram illustrating the counter of FIG. 1. The counter 131 shown in FIG. 3 is a 4-bit counter including a synchronous counter circuit and it is apparent to those of ordinary skill in the art that, besides the counter 131 used in the voltage detection device, various types of counters such as an asynchronous counter circuit may be also used in the voltage detection device.

The counter 131 receives the first and second clock signals CK_1 and CK_2 and performs a counting operation by using the received first and second clock signals CK_1 and CK_2. For this, the counter 131 may include a plurality of flip-flops 131_1 to 131_4 and a logic circuit 131_5. The flip-flops 131_1 to 131_4 receive the first clock signal CK_1 as an enable signal and operate in synchronization with the second clock signal CK_2. The first flip-flop 131_1 generates an output Q[0] in response to the toggling of the second clock signal CK_2 and the output Q[0] is provided as an input of an adder HA1 of the logic circuit 131_5. Additionally, the second and fourth flip-flops 131_2 and 131_4 generate outputs Q[1] and Q[3], respectively, according to an operation of the first adder HA1 and an operation of a second adder HA2 receiving a carry value of the first adder HA1. Additionally, the third flip-flop 131_3 generates an output Q[2] according to an output of an XOR gate receiving a carry value of the second adder HA2. The respective outputs Q[0] to Q[3] of the flip-flops 131_1 and 131_4 are provided as a counting signal Cout to the comparator 132 of FIG. 1.

Figure 4:
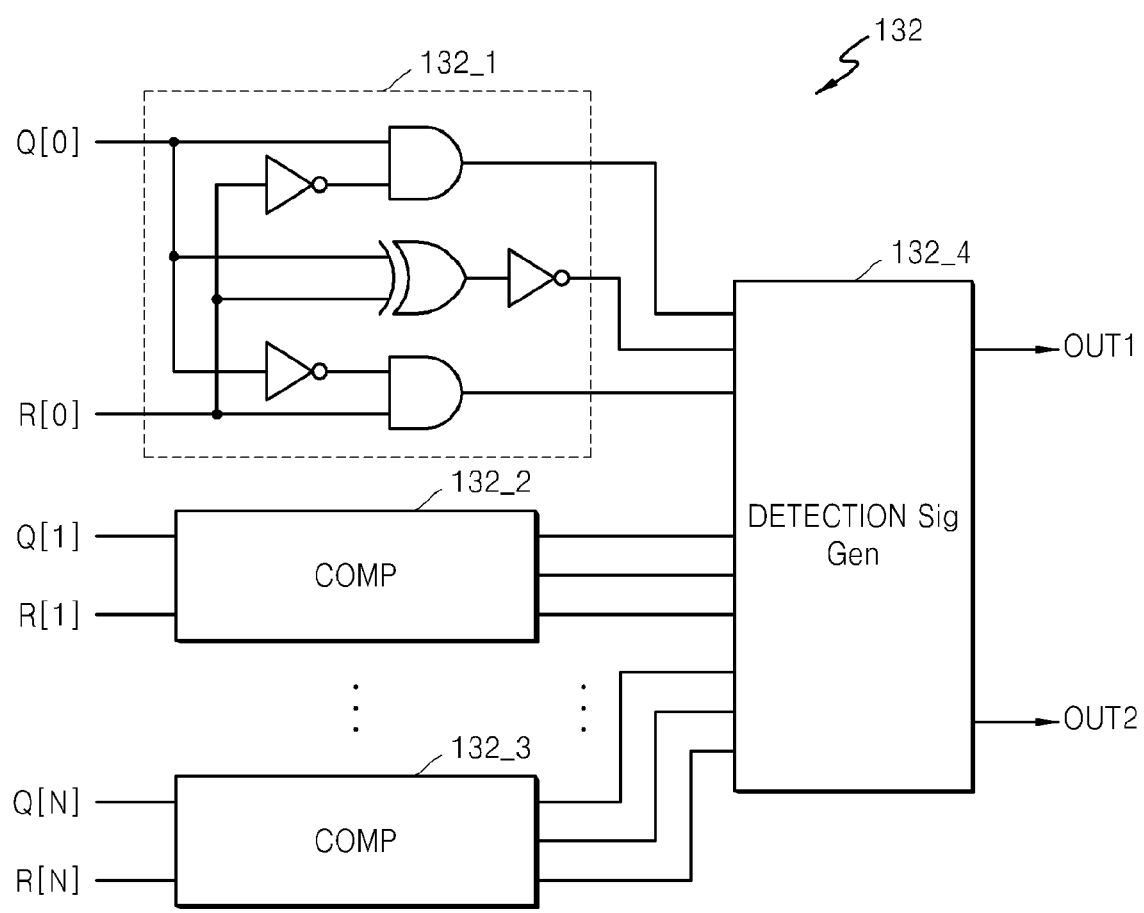
FIG. 4 is a circuit diagram illustrating the comparator of FIG. 1 according to an embodiment.

FIG. 4 is a circuit diagram illustrating the comparator of FIG. 1 according to an exemplary embodiment. As shown in FIG. 4, the comparator 132 may include a plurality of comparator circuits 132_1 to 132_3 for comparing digital signal sizes and a detection signal generator 132_4 for generating detection signals Out1 and Out2 by combining the comparison results of the plurality of comparator circuits 132_1 to 132_3. Each of the comparator circuits 132_1 to 132_3 may include a logic circuit for comparing the sizes of 1-bit input signals. For example, each of the comparator circuits 132_1 to 132_3 compares one bit of the counting signal Cout with one bit of a predetermined reference value stored in the comparator 132. The first comparator circuit 132_1 compares the 1-bit signal Q[0] of the counting signal Cout with the 1-bit signal R[0] of the reference value and provides a comparison result to the detection signal generator 132_4. Similarly, the remaining bits of the counting signal Cout are compared with the remaining bits of the reference value and the comparison result is provided to the detection signal generator 132_4. A plurality of comparator circuits corresponding in number to the number of bits in the counting signal Cout or the reference value may be included in the comparator 132.

The detection signal generator 132_4 combines the comparison results of the comparator circuits 132_1 to 132_3 to output the detection signals Out1 and Out2. For example, by comparing the comparison results of the comparator circuits 132_1 to 132_3, a size relationship of the counting signal Cout and the reference value may be determined and also a difference between the counting signal Cout and the reference value may be determined. According to the size relationship of the counting signal Cout and a critical value, the first detection signal Out1 or the second detection signal Out2 may be activated. Additionally, if each of the first and second detection signals Out1 and Out2 includes a plurality of bits, the first detection signal Out1 or the second detection signal Out2 respectively having different values according to a difference between the counting signal Cout and the reference value may be generated.

Figure 5:
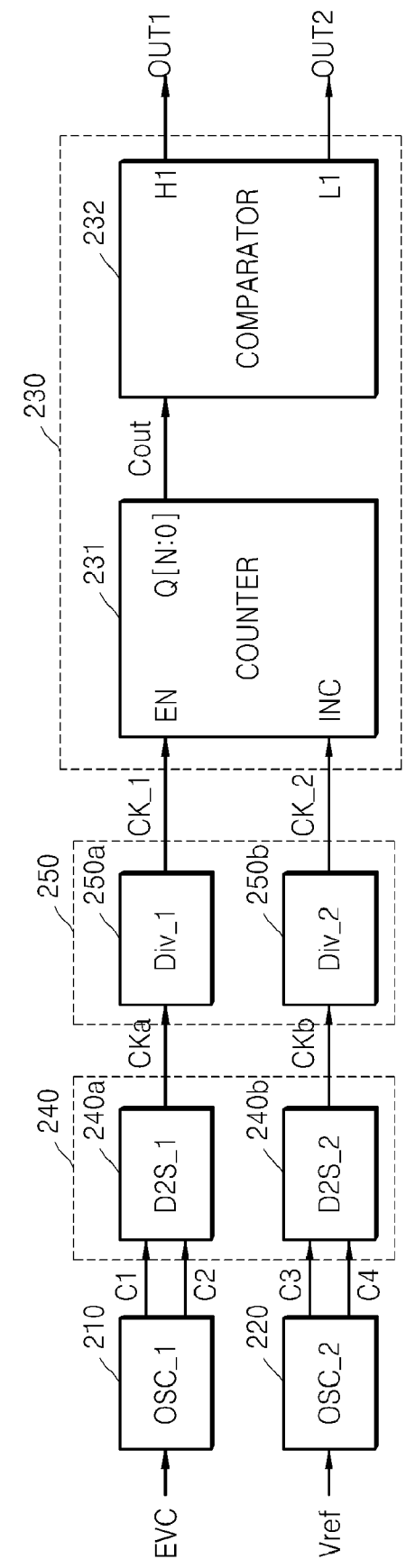
FIG. 5 is a block diagram illustrating a voltage detection device according to another embodiment.

FIG. 5 is a block diagram illustrating a voltage detection device according to another exemplary embodiment. As shown in FIG. 5, the voltage detection device 200 may include a first clock generator 210, a second clock generator 220, and a detector 230, and may further include a signal converter 240 for converting a differential signal into a single signal and a frequency divider 250 for dividing a clock signal. Additionally, the detector 230 may include a counter 231 and a comparator 232.

The first clock generator 210 generates first differential clock signals C1 and C2 having a period that changes according to a level of an external voltage EVC. The second clock generator 220 generates second differential clock signals C3 and C4 having a fixed period corresponding to a level of a reference voltage Vref. Like the above embodiment, the first clock generator 210 or the second clock generator 220 may be realized with a device for generating an oscillation signal, for example, a ring oscillator.

The signal converter 240 receives the first differential clock signals C1 and C2 and the second differential clock signals C3 and C4 from the first and second clock generators 210 and 220 and converts the received signals into single signals CKa and CKb. For this, the signal converter 240 may include a first converter 240a and a second signal converter 240b. The first signal converter 240a receives the first differential clock signals C1 and C2 and converts them into the first single signal CKa and the second signal converter 240b receives the second differential clock signals C3 and C4 and converts them into the second single signal CKb.

The frequency divider 250 receives the first and second single signals CKa and CKb and divides them to generate divided clock signals CK_1 and CK_2. The frequency divider 250 may include a first frequency divider 250a and a second frequency divider 250b. The first frequency divider 250a divides the first single signal CKa to generate the first divided clock signal CK_1 and the second frequency divider 250b divides the second single signal CKb to generate the second divided clock signal CK_2. The first and second divided clock signals CK_1 and CK_2 are provided to the counter 231 in the detector 230. That is, the first divided clock signal CK_1 is inputted to a first input terminal EN of the counter 231 and the second divided clock signal CK_2 is inputted to a second input terminal INC of the counter 231. The counter 231 is enabled during a first state (for example, logic high) of the first divided clock signal CK_1 and counts the clocks of the second divided clock signal CK_2 provided to the second input terminal INC during an enable interval. A counting signal Cout obtained by counting the clocks of the second divided clock signal CK_2 is provided to the comparator 232 through an output terminal Q[N:0] of the counter 231. The comparator 232 compares a predetermined reference value (not shown) stored therein with the resulting signal Cout and then outputs the comparison result as the detection signals Out1 and Out2.

The first and second clock generators 210 and 220 generate oscillation signals as differential signals and convert the differential signals into single signals to perform counting and comparing operations. Therefore, a level change of the external voltage EVC may be more accurately detected. Additionally, if an oscillation signal from the first and second clock generators 210 and 220 and a single signal from the signal converter 240 have a short period, there is high possibility that errors occur during a counting operation. Thus, the periods of the first and second single signals CKa and CKb may be lengthened through a dividing operation of the frequency divider 250.

The first and second frequency dividers 250a and 250b may have the same or different division values. For example, since an output (i.e., the first divided clock signal CK_1) of the first frequency divider 250a is used for an enable operation of the counter 231 and an enable interval of the first divided clock signal CK_1 varies according to a level change of the external voltage EVC, a division value of the first frequency divider 250a may be set with a relatively large value. Meanwhile, since an output (i.e., the second divided clock signal CK_2) of the second frequency divider 250b is used as a signal, actual frequencies of the output are counted in the counter 231, the second frequency divider 250b may be set with a relatively small value to obtain a different counting result according to the enable interval. For example, a division value of the first frequency divider 250a may be set with a larger value than the second frequency divider 250b.

Figure 6:
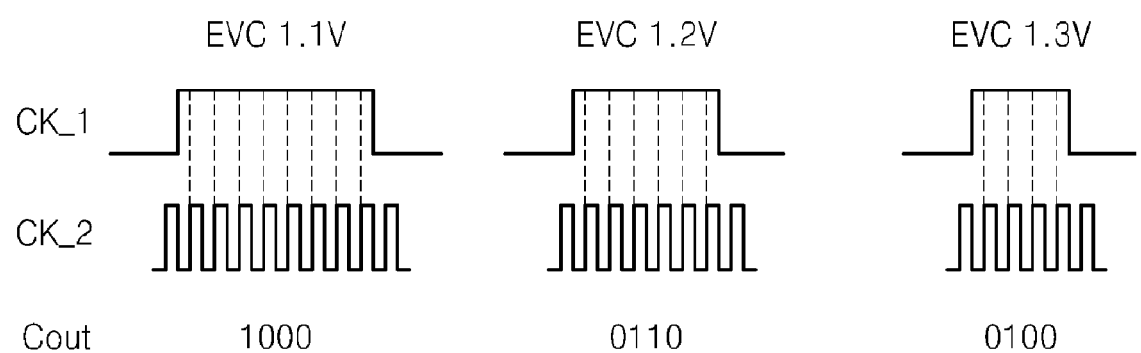
FIG. 6 is a waveform diagram illustrating a signal characteristic of the voltage detection device of FIG. 5.

FIG. 6 is a waveform diagram illustrating a signal characteristic of the voltage detection device of FIG. 5. As shown in FIG. 6, a first divided clock signal CK_1 generated using an external voltage EVC has respective periods according to a level change of the external voltage EVC. For example, when a level of the external voltage EVC is relatively small, the first divided clock signal CK_1 has a large period. Meanwhile, a reference voltage Vref has a predetermined level, and accordingly, a second divided clock signal CK_2 generated using the reference voltage Vref has a predetermined period. For example, since the second divided clock signal CK_2 toggles eight times during a logic high interval of the first divided clock signal CK_1 generated using the external voltage EVC of 1.1 V, the counter 231 counts the clocks of the second divided clock signal CK_2 to output a counting signal Cout with "1000". Since the second divided clock signal CK_2 toggles four times during a logic high interval of the first divided clock signal CK_1, the counter 231 outputs a counting signal with "0100". Although this embodiment uses the waveform diagram of FIG. 6 to illustrate a signal characteristic of the voltage detection device of FIG. 5, it may also illustrate a signal characteristic of the voltage detection device of FIG. 1. That is, the signal CK_1 of FIG. 6 may be an output of the first clock generator 110 of FIG. 1; the signal CK_2 of FIG. 6 may be an output of the second clock generator 120 of FIG. 1; and the counting signal Cout of FIG. 6 may be an output signal of the counter 131 of FIG. 1.

Figure 7:
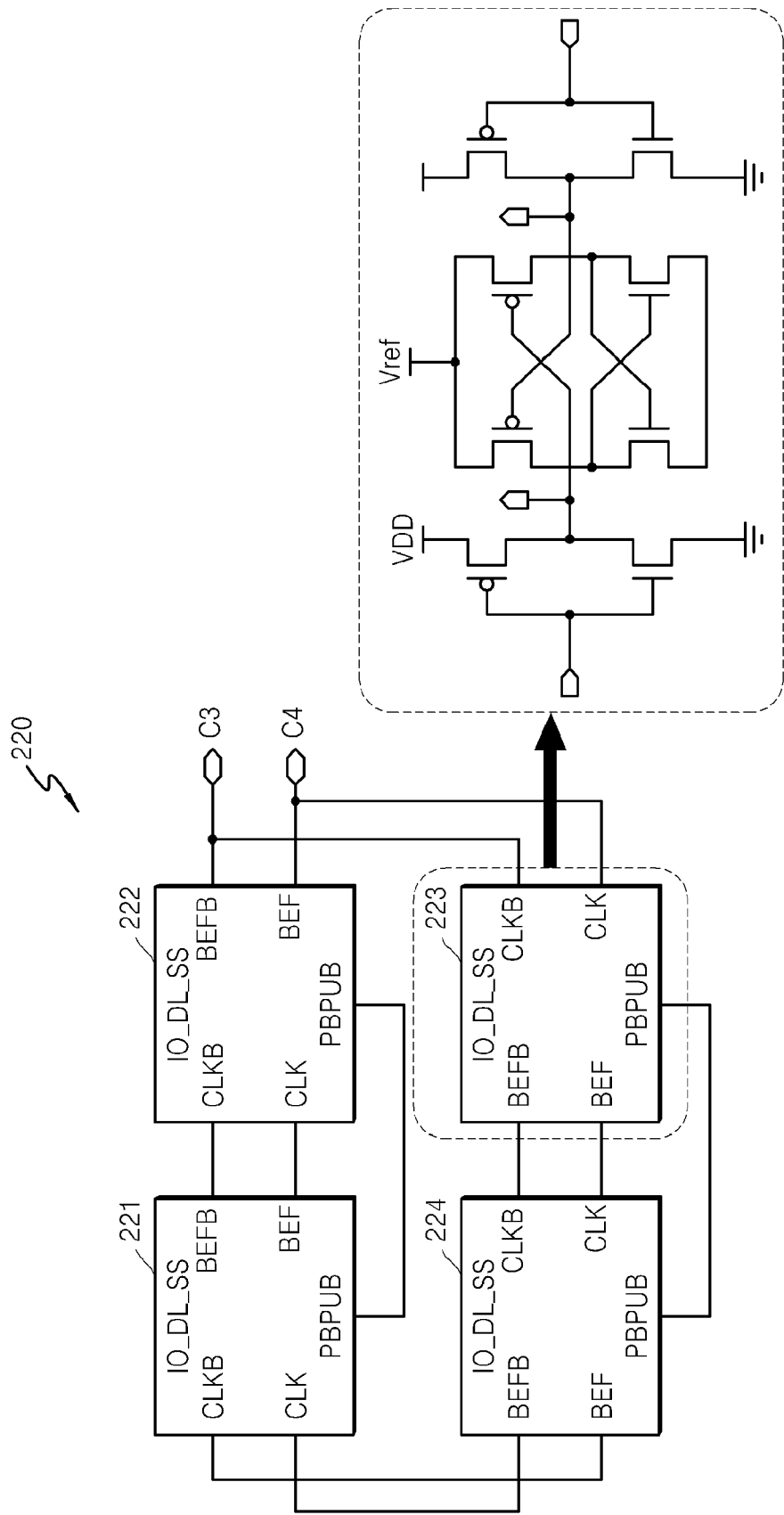
FIG. 7 is a circuit diagram illustrating the second clock generator of FIG. 5 according to an embodiment.

FIG. 7 is a circuit diagram illustrating the second clock generator of FIG. 5 according to an exemplary embodiment. As one example, an embodiment of the second clock generator 220 of FIG. 5 is shown in FIG. 7 and the first clock generator 210 of FIG. 5 may be realized identical or similar to the embodiment of FIG. 7.

As shown in FIG. 7, the clock generator 220 may include a ring oscillator. The ring oscillator may include a plurality of differential amplifiers 221 to 224 connected in a ring form. Additionally, the differential amplifiers 221 to 224 receive a reference voltage Vref and a differential output of a differential amplifier in a previous stage is provided to a differential input terminal of a differential amplifier in the next stage. For example, a differential output of the first differential amplifier 221 is provided to a differential input terminal of the second differential amplifier 222 and a differential output of the third differential amplifier 223 is provided to a differential input terminal of the fourth differential amplifier 224. Additionally, for an oscillation operation, a differential output of the fourth differential amplifier 224 is provided to a differential input terminal of the first differential amplifier 221. A differential output of one differential amplifier, for example, the second differential amplifier 222, is provided as differential oscillation signals C3 and C4 having a voltage-frequency characteristic, to the external.

Figure 8:
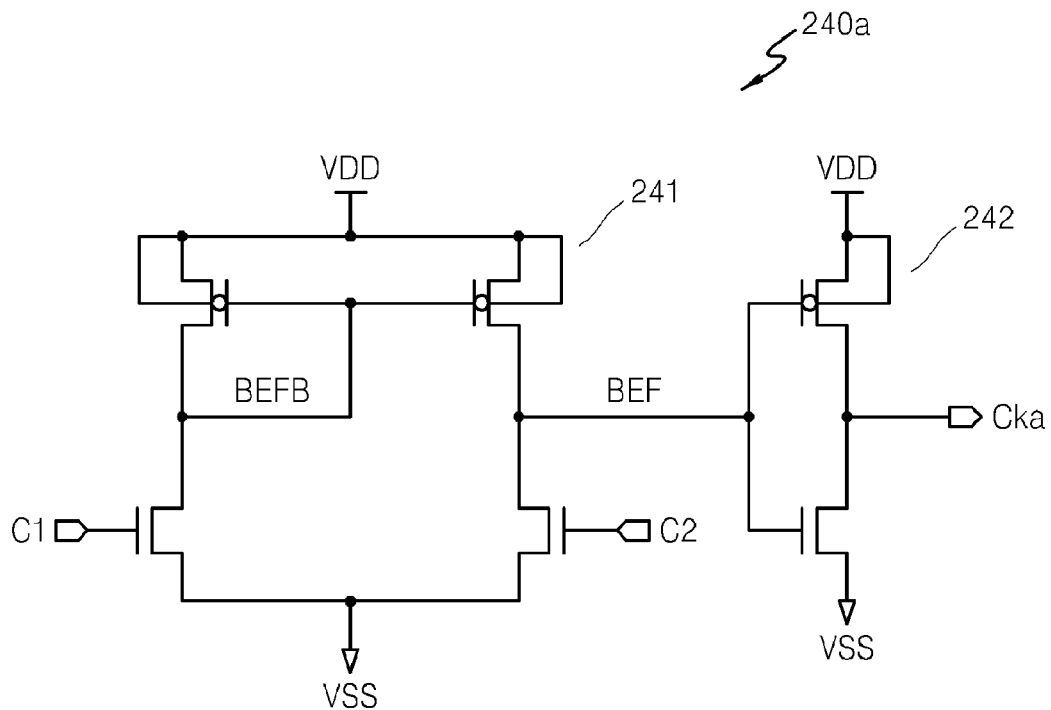
FIG. 8 is a circuit diagram illustrating the signal converter of FIG. 5 according to an embodiment.

FIG. 8 is a circuit diagram illustrating the signal converter of FIG. 5 according to an exemplary embodiment. That is, FIG. 8 illustrates an exemplary embodiment of one (for example, the first signal converter 240a) among the signal converters 240a and 240b in FIG. 5.

As shown in FIG. 8, the first signal converter 240a may include a differential amplifier 241 and an inverter 242. The differential amplifier 241 includes two NMOS transistors in a differential pair and two PMOS transistors having a current mirror structure. The differential signals C1 and C2 from the first clock generator 210 of FIG. 5 are provided to the respective gate terminals of the two NMOS transistors. The differential amplifier 241 generates an output signal BEF according to a voltage difference between the differential signals C1 and C2 and provides the output signal BEF to an input terminal of the inverter 242. Then, the inverter 242 inverts the output signal BEF to generate the first single signal CKa.

Figure 9:
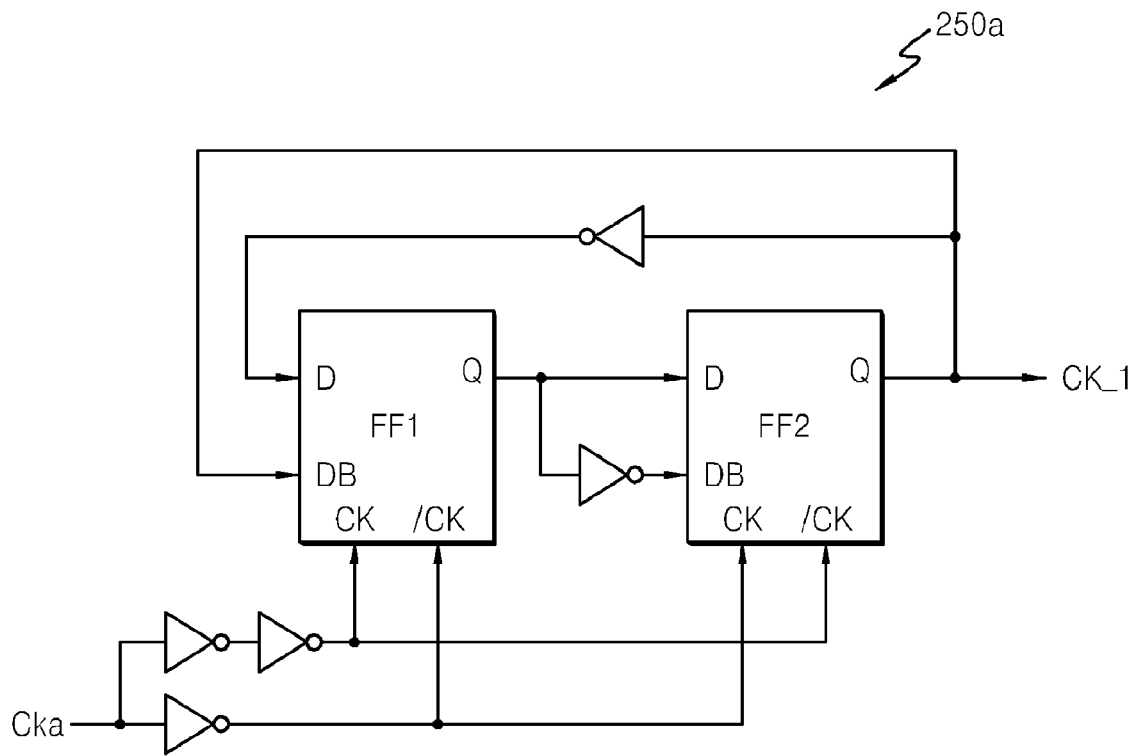
FIG. 9 is a circuit diagram illustrating the frequency divider of FIG. 5 according to an embodiment.

FIG. 9 is a circuit diagram illustrating the frequency divider of FIG. 5 according to an exemplary embodiment. As mentioned above, the frequency divider 250 may be equipped in the voltage detection device 200 of FIG. 5. The frequency divider 250 receives the first and second single signals CKa and CKb from the signal converter 240 and generates a frequency divided signal. FIG. 9 illustrates an exemplary embodiment of the first frequency divider 250a in the frequency divider 250 and the second frequency divider 250b may be realized identical or similar to the exemplary embodiment of FIG. 9. Additionally, although a divider for performing a divide-by-2 operation on the first single signal CKa is exemplarily illustrated in FIG. 9, a different divider for dividing the first single signal CKa with another value may be also applied to an exemplary embodiment of the inventive concept.

As shown in FIG. 9, the first frequency divider 250a may include at least one flip-flop FF1 or FF2 and at least one inverter. The first frequency divider 250a receives the first single signal CKa from the first signal converter 240a of FIG. 5 and generates the first divided clock signal CK_1 obtained by dividing the first single signal CKa. The first single signal CKa is inverted by the inverter and the first single signal CKa and a signal obtained by inverting thereof are respectively provided to the first and second flip-flops FF1 and FF2. The inputs/outputs of the first and second flip-flops FF1 and FF2 have a feedback structure. For example, an output of the first flip-flop FF1 and an output obtained by inverting thereof are provided to a differential input terminal of the second flip-flop FF2. Also, an output of the second flip-flop FF2 and an output obtained by inverting thereof are provided to a differential input terminal of the first flip-flop FF1. An output of one flip-flop, for example, the second flip-flop FF2, is provided as the first divided clock signal CK_1 to the detector 230 of FIG. 5.

Figure 10:
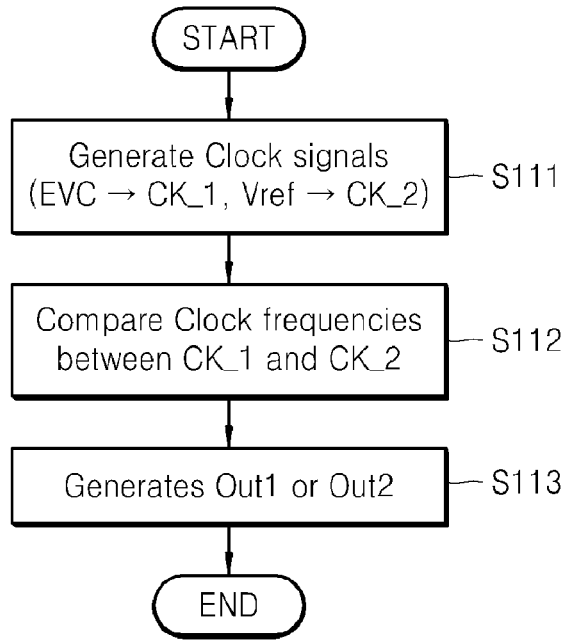
FIG. 10 is a flowchart illustrating a voltage detection method according to an embodiment.

FIG. 10 is a flowchart illustrating a voltage detection method according to an exemplary embodiment. As mentioned above, once a voltage detection device operates, an external voltage EVC and a reference voltage Vref are provided to the voltage detection device. Then, as shown in FIG. 10, the voltage detection device generates a first clock signal CK_1 by using the external voltage EVC and generates a second clock signal CK_2 by using the reference voltage Vref in operation S111.

As mentioned above, when the voltage detection device is applied to a semiconductor such as a DRAM device, the external voltage EVC may be a voltage signal provided from the external of the semiconductor device and the reference voltage Vref may be a voltage signal generated in the semiconductor device. Additionally, the external voltage EVC and the reference voltage Vref are provided to separate devices for generating an oscillation signal and the devices may be realized with a ring oscillator. A first clock signal CK_1 is a clock signal having a period that changes according to a level change of the external voltage EVC and a second clock signal CK_2 is a clock signal having a period (or a frequency) corresponding to a level of the reference voltage Vref.

Next, periods or frequencies of the first clock signal CK_1 and the second clock signal CK_2 are compared with one another in operation S112. For example, as a level of the external voltage EVC increases, a period of the first clock signal CK_1 decreases and a frequency of the first clock signal CK_1 increases. Comparison results regarding the periods (or frequencies) of the first clock signal CK_1 and the second clock signal CK_2 are outputted as detection signals Out1 and Out2 obtained by detecting a level of the external voltage EVC in operation S113. For example, when a level of the external voltage EVC is greater than a predetermined level, the first detection signal Out1 is activated, and on the contrary, when a level of the external voltage EVC is less than the predetermined level, the second detection signal Out2 is activated. Additionally, the predetermined level may be set with a value corresponding to a normal voltage level of the external voltage EVC.

Figure 11:
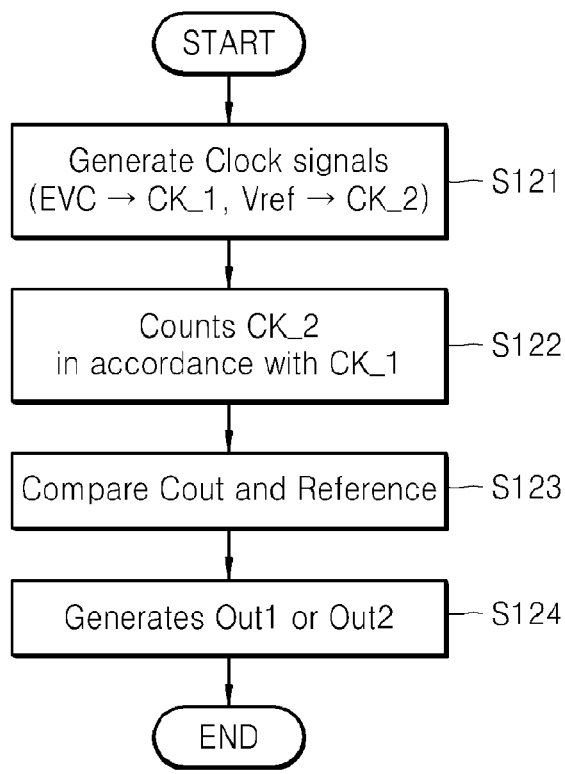
FIG. 11 is a flowchart illustrating a voltage detection method according to another embodiment.

FIG. 11 is a flowchart illustrating a voltage detection method according to another exemplary embodiment. As mentioned above, an external voltage EVC and a reference voltage Vref are provided to a voltage detection device. Then, as shown in FIG. 11, the voltage detection device generates a first clock signal CK_1 and a second clock signal CK_2, which have respective periods (or frequencies) corresponding to the levels of the external voltage EVC and the reference voltage Vref in operation S121.

Next, a counting operation and a comparison operation are performed to detect a level of the external voltage EVC. The counting operation counts the clocks of the second clock signal CK_2 in accordance with the first clock signal CK_1 in operation S122. For example, the voltage detection device includes a counter. Thus, the voltage detection device enables the counter during a logic high interval of the first clock signal CK_1 and counts the edges of the second clocks signal CK_2 during an enable interval of the counter. As the external voltage EVC is increased, a period of the first clock signal CK_1 decreases and a value of counting the edges of the second clock signal CK_2 during a logic high interval of the first clock signal CK_1 is relatively small. On the contrary, as the external voltage EVC decreases, a period of the first clock signal CK_1 increases and a value of counting the edges of the second clock signal CK_2 during a logic high interval of the first clocks signal CK_1 is relatively large. A counting signal Cout according to a counting result is compared with a predetermined reference value by using a comparator in the voltage detection device in operation S123. Then, a comparison result of the counting signal and the reference signal is outputted as detection signals Out1 and Out2 obtained by detecting a level of the external voltage EVC in operation S124.

Figure 12:
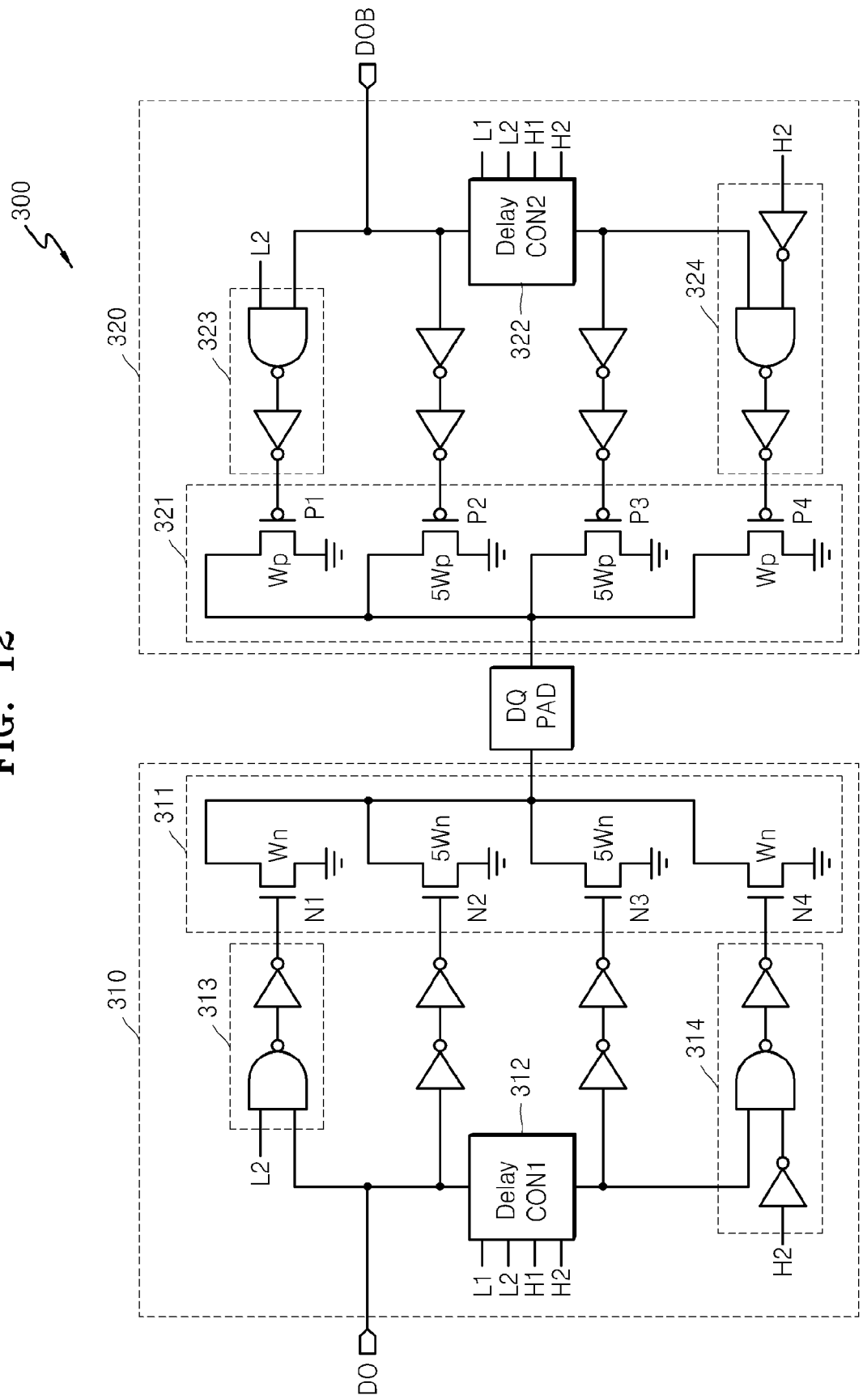
FIG. 12 is a block diagram illustrating an input/output buffer of a semiconductor device according to an embodiment.

FIG. 12 is a block diagram illustrating an input/output buffer of a semiconductor device according to an exemplary embodiment. As shown in FIG. 12, the semiconductor device includes an input/output buffer for transmitting and receiving data through an input/output pad DQ PAD. FIG. 12 illustrates an output buffer 300 connected to the input/out pad DQ PAD. Additionally, the output buffer 300 may include a pull-down unit 310 for pulling down a signal outputted through the input/output pad DQ PAD and a pull-up unit 320 for pulling up a signal outputted through the input/output pad DQ PAD.

Each of the pull-down unit 310 and the pull-up unit 320 of the output buffer 300 includes a driver for driving data transmitted through the input/output pad DQ PAD. For example, the pull-down unit 310 includes a pull-down driver 311 including at least one transistor and the pull-up unit 320 includes a pull-up driver 321 including at least one transistor. In order to increase and adjust the driver strength of the output buffer 300, each of the pull-down unit 310 and the pull-up unit 320 includes a plurality of transistors. As shown in FIG. 12, the pull-down driver 311 includes a plurality of NMOS transistors N1 to N4, which may be realized with respectively different driver strengths and sizes. Similarly, the pull-up driver 321 includes a plurality of PMOS transistors P1 to P4, which may be realized with respectively different sizes.

The semiconductor device including the output buffer 300 is equipped with the voltage detection device (not shown) according to the above-mentioned embodiment. The voltage detection device detects a level of an external voltage and generates detection signals L1, L2, H1, and H2 according to a detection result. Various functional blocks in the output buffer 300 are controlled in response to the detection signals L1, L2, H1 and H2 from the voltage detection device. For example, as shown in FIG. 12, the detection signals L1, L2, H1 and H2 from the voltage detection device are used as control signals to control the driving performance and characteristics of the pull-down unit 310 and the pull-up unit 320.

Besides the plurality of NMOS transistors N1 to N4, the pull-down unit 310 may further include a first delay control unit 312 for sequentially driving the NMOS transistors N1 to N4 and first and second enable control units 313 and 314 for enabling the NMOS transistors N1 to N4. Similarly, besides the plurality of PMOS transistors P1 to P4, the pull-up unit 320 may further include a second delay control unit 322 for sequentially driving the PMOS transistors P1 to P4 and third and fourth enable control units 323 and 324 for enabling the PMOS transistors P1 to P4. A configuration of the pull-down unit 310 will be mainly described as follows in relation to an operation of the output buffer 300 according to an exemplary embodiment.

In order to increase the driver strength of a pull-down or pull-up operation, the plurality of NMOS transistors N1 to N4 are included in the pull-down unit 310 or the plurality of PMOS transistors P1 to P4 are included in the pull-up unit 320. However, when the NMOS transistors N1 to N4 or the PMOS transistors P1 to P4 are turned on simultaneously, back electromotive force may occur due to an inductance component. As a result of this, power noise may occur in an output signal. Additionally, when the NMOS transistors N1 to N4 or the PMOS transistors P1 to P4 are operated sequentially in order to reduce the power noise of the output signal, since delay time for a sequential operation increases, output time of data may also increase.

The first delay control unit 312 of the pull-down unit 310 controls a delay operation for input data DO to prevent the plurality of NMOS transistors N1 to N4 of the pull-down driver 311 from being turned on simultaneously. The first delay control unit 312 controls delays of the input data DO in response to the detection signals L1, L2, H1, and H2 from the voltage detection device. The detection signals L1, L2, H1, and H2 may have at least one bit value. For example, when a level of an external voltage is less than a predetermined level, the detection signals L1 and L2 are activated and, when otherwise, the detection signals H1 and H2 are activated. Additionally, the values of the detection signals L1, L2, H1, and H2 may vary according to a level difference between the external voltage and the reference voltage. For example, when the external voltage is less than the predetermined level by 0.1 V, L1 and L2 may have "1" and "0", respectively. If the external voltage is less than the predetermined level by 0.3 V, L1 and L2 have "1". It is assumed in the following description that the detection signals L2 and H2 have values of an upper bit than the detection signals L1 and H1.

The first delay control unit 312 controls delays of the input data DO in response to the detection signals L1, L2, H1, and H2. For example, when a level of the external voltage is greater than a predetermined level, the driver strength of the pull-down driver 311 is increased. Thus, the first delay control unit 312 decreases an output speed of the data by increasing the delays of the input data DO. On the contrary, when a level of the external voltage is less than the predetermined level, since the driver strength of the pull-down driver 311 is decreased, the first delay control unit 312 increases an output speed of the data by decreasing the delays of the input data DO.

Additionally, the first and second enable control units 313 and 314 enable the NMOS transistors N1 to N4 for driving data. Moreover, each of the first and second enable control units 313 and 314 performs a control operation in response to at least one of the detection signals L1, L2, H1, and H2. For example, the first enable control unit 313 is connected to a gate of the first NMOS transistor N1 and turns on or off the first NMOS transistor N1 in response to the detection signal L2. Similarly, the second enable control unit 314 is connected to a gate of the fourth NMOS transistor N4 and turns on or off the fourth NMOS transistor in response to the detection signal H2.

If a level of the external voltage is greater than a predetermined level, the detection signal L2 has "0" and the detection signal H2 has "0" or "1". If the detection signal L2 has "0", the first enable control unit 313 generates a control signal corresponding to logic low regardless of a state of the input data DO and the first NMOS transistor N1 is turned off in response to the control signal of the logic low. As the first NMOS transistor N1 is turned off, the driver strength of the pull-down driver 311 is reduced. Additionally, the detection signal H2 has "0" or "1" and according thereto, the second enable control unit 314 generates a control signal of logic low or logic high. If a level of the external voltage is greater than a predetermined level by a predetermined value, the detection signal H2 has "1" and in this case, the second enable control unit 314 generates a control signal corresponding to logic low regardless of a state of the input data DO. Accordingly, since the fourth NMOS transistor N4 is turned off also, the driver strength of the pull-down driver 311 may be further decreased. On the contrary, if a difference between the external voltage level and the predetermined level is relatively small, the detection signal H2 may have "0" and in this case, the fourth NMOS transistor N4 is turned on or off in response to a state of the input data DO.

Similarly, the second delay control unit 322 of the pull-up unit 320 controls delays of complementary input data DOB in response to the detection signals L1, L2, H1, and H2 from the voltage detection device. Additionally, the third enable control unit 323 turns on or off the first PMOS transistor P1 in response to the detection signal L2 and the fourth enable control unit 324 turns on or off the fourth PMOS transistor P4 in response to the detection signal H2.

According to the output buffer 300 of the semiconductor device, the voltage detection device (not shown) may adjust a data output speed of the output buffer 300 in the semiconductor device according to a result obtained by detecting a level of an external voltage. Accordingly, since an operation of the output buffer 300 of the semiconductor device is adjusted in correspondence to a change of the external voltage, performance of the semiconductor device may be improved. Additionally, an external controller may effectively receive data of the semiconductor device by adjusting a data output speed of the output buffer 300 to be uniform in correspondence to a change of an external voltage.

Figure 13:
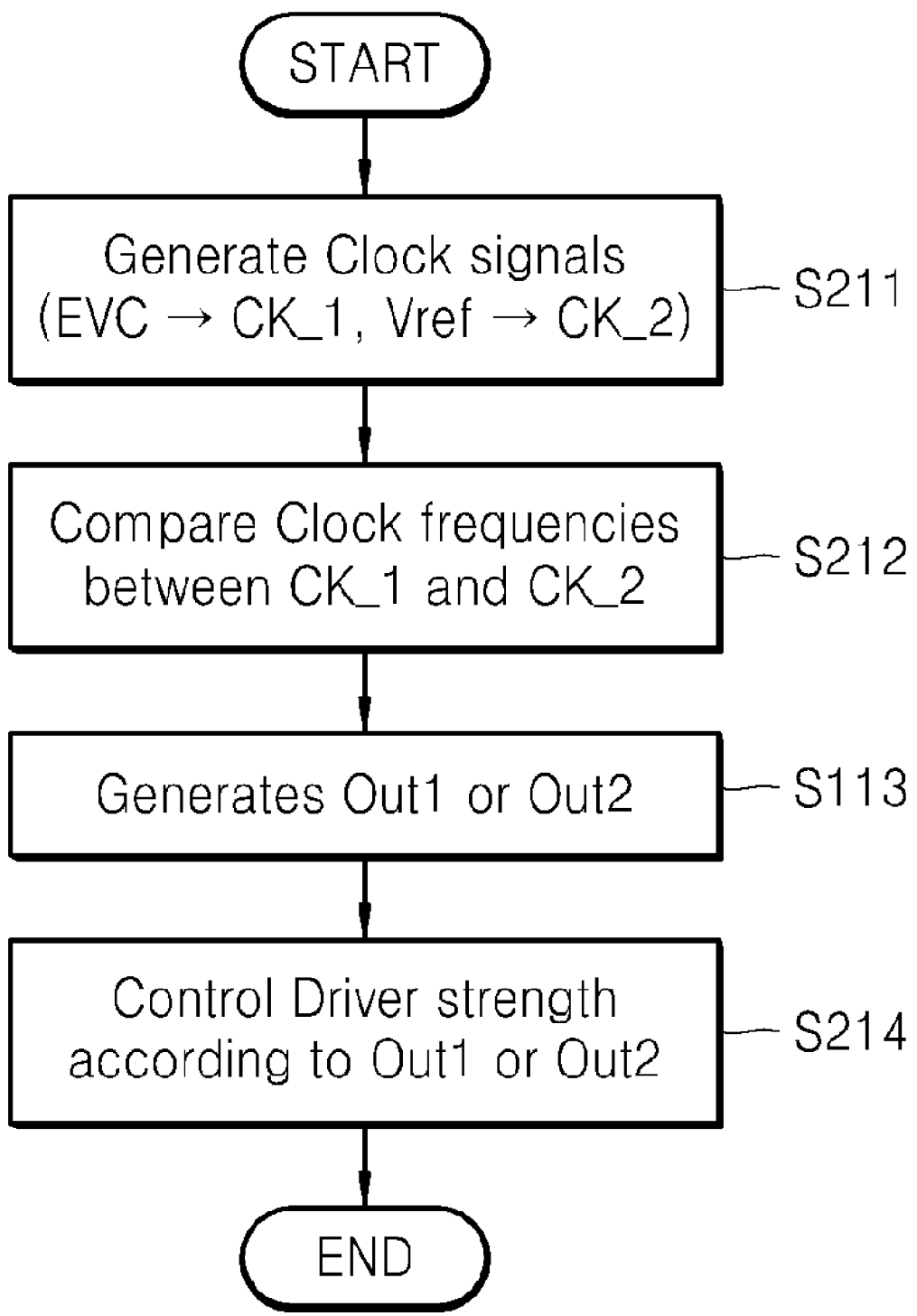
FIG. 13 is a flowchart illustrating a method of operating a semiconductor device according to an embodiment.

FIG. 13 is a flowchart illustrating a method of operating a semiconductor device according to an exemplary embodiment. As shown in FIG. 13, the semiconductor device includes a voltage detection device and voltage signals for a comparison operation are provided to the voltage detection device. For example, an external voltage EVC provided to the semiconductor device and a reference voltage Vref generated in the semiconductor device are provided to the voltage detection device. The voltage detection device generates a first clock signal CK_1 and a second clock signal CK_2, which have respective periods (or frequencies) corresponding to levels of the external voltage EVC and the reference voltage Vref in operation S211. Since a level of the external voltage EVC may vary according to various factors, a period of the first clock signal CK_1 is also changed according to a level change of the external voltage EVC. Then, periods (or frequencies) of the first clock signal CK_1 and the second clock signal CK_2 are compared with one another in operation S212 and according to a comparison result of the periods (or frequencies) of the first and second clock signals CK_1 and CK_2, detection signals Out1 and Out2 obtained by detecting a level of the external voltage EVC are generated in operation S213.

Operations of the semiconductor device are controlled in response to the detection signals Out1 and Out2. For example, a pull-up driver and/or a pull-down driver in an output buffer of the semiconductor device are/is controlled in response to the detection signals Out1 and Out2 in operation S214. If it is detected that a level of the external voltage EVC is greater than a predetermined level, an output speed of data in the output buffer is controlled to be reduced in response to the detection signals Out1 and Out2. Alternatively, if it is detected that a level of the external voltage EVC is less than a predetermined level, an output speed of data in the output buffer is controlled to be increased in response to the detection signals Out1 and Out2.

Figure 14:
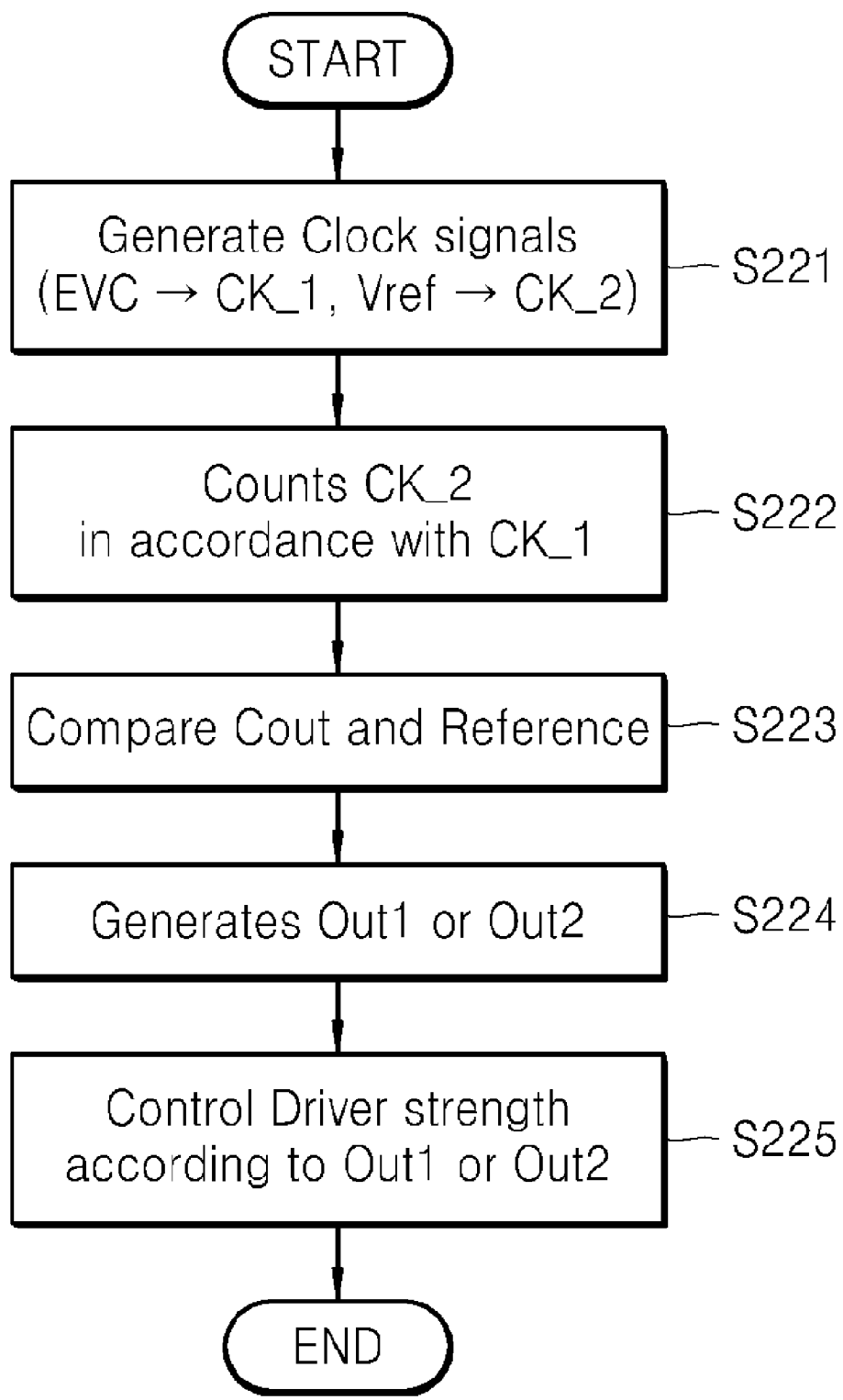
FIG. 14 is a flowchart illustrating a method of operating a semiconductor device according to another embodiment.

FIG. 14 is a flowchart illustrating a method of operating a semiconductor device according to another exemplary embodiment. As shown in FIG. 14, the voltage detection device generates a first clock signal CK_1 and a second clock signal CK_2, which have respective periods (or frequencies) corresponding to levels of the external voltage EVC and the reference voltage Vref in operation S221. Additionally, the voltage detection device counts the edges of the second clock signal CK_2 on the basis of the first clock signal CK_1 in operation S222. For example, the edges of the second clock signal CK_2 may be counted during a logic high interval of the first clock signal CK_1 and a counting signal Cout is compared with a predetermined reference value by a comparator in the voltage detection device in operation S223. Moreover, a comparison result of the counting signal Cout and the reference value is provided as detection signals Out1 and Out2 obtained by detecting a level of the external voltage EVC.

Additionally, operations of the semiconductor device are controlled in response to the detection signals Out1 and Out2 in operation S225. For example, a pull-up driver and/or pull-down driver in an output buffer of the semiconductor device are/is controlled. According to a comparison result of a level of the external voltage EVC and a level of the reference voltage Vref, an output speed of data in the output buffer is decreased or increased.

Figure 15:
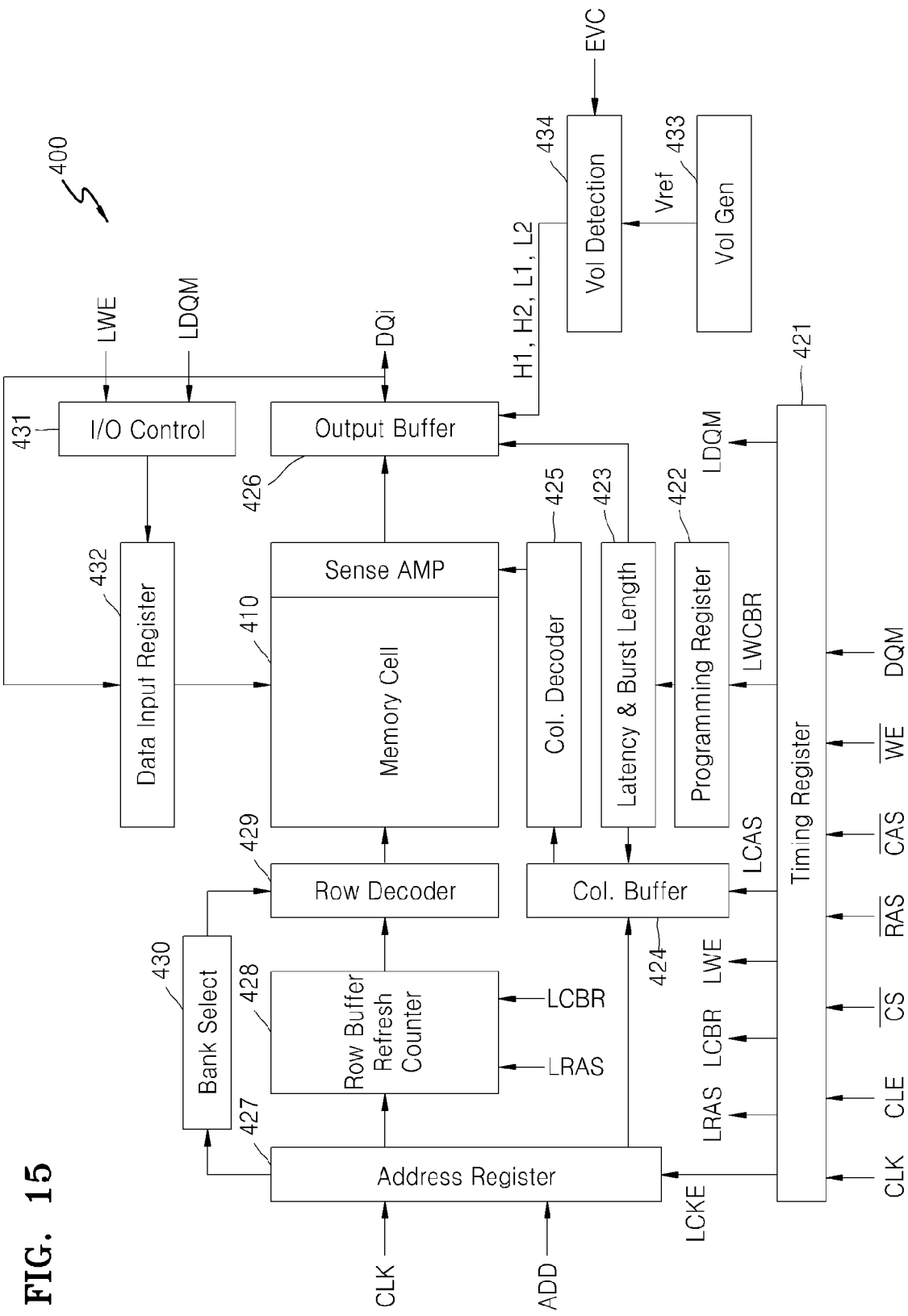
FIG. 15 is a block diagram illustrating a semiconductor memory device according to an embodiment.

FIG. 15 is a block diagram illustrating a semiconductor memory device according to an exemplary embodiment. Although DDR-SDRAM is exemplarily illustrated as the semiconductor memory device in FIG. 15, the semiconductor memory device is not limited thereto and the above-mentioned voltage detection device may be applied to another memory device.

As shown in FIG. 15, the semiconductor memory device 400 may include a memory cell array 410 with DRAM cells and various circuit blocks for driving the DRAM cells. For example, a timing register 421 is enabled when a chip selection signal CS is changed from a disable level (for example, logic high) to an enable level. The timing register 421 receives command signals such as a clock signal CLK, a clock enable signal CKE, a chip selection signal CSB, a row address strobe signal RASB, a column address strobe signal CASB, a write enable signal WEB, and a data input/output mask signal DQM and then, generates various internal command signals such as LRAS, LCBR, LWE, LCAS, LWCBR, and LDQM by processing the received command signals, so as to control the circuit blocks. Some internal command signals generated by the timing register 421 are stored in a programming register 422. For example, latency information relating to data output or burst length information may be stored in the programming register 422. The internal command signals stored in the programming register 422 may be provided to a latency/burst length control unit 423. The latency/burst length control unit 423 may provide a control signal for controlling latency of data output or burst length, to a column decoder 425 or an output buffer 426 through a column buffer 424.

An address register 427 receives an address signal ADD from the external. A row address signal is provided to a row decoder 429 through a row buffer refresh counter 428. Additionally, a column address signal is provided to a column decoder 425 through a column address buffer 424. The row buffer refresh counter 428 may further receive a refresh address signal occurring in a refresh counter in response to refresh commands LRAS and LCBR and provides one of the row address signal and the refresh address signal to the row decoder 429. Additionally, the address register 427 may provide a bank signal for selecting a bank, to a bank select unit 430.

The row decoder 429 decodes a row address signal or a refresh address signal, inputted from the row buffer refresh counter 428, and enables a word line of the memory cell array 410. Additionally, the column decoder 425 decodes a column address signal and performs a selection operation on a bit line of the memory cell array 410. As one example, a column selection line is applied to the semiconductor memory device 400, thereby performing a selection operation through the column selection line. A detection amplifier amplifies data of a memory cell selected by the row decoder 429 and the column decoder 425 and provides the amplified data to the output buffer 426. Meanwhile, data for writing data cell are provided to the memory cell array 410 through the data input register 432 and an input/output controller 431 controls a data transfer operation through the data input register 432.

As shown in FIG. 15, the semiconductor memory device 400 may further include a voltage generation unit 433 and a voltage detection unit 434. The voltage detection unit 434 may have a configuration identical or similar to that of the voltage detection device according to the above-mentioned various exemplary embodiments. The voltage generation unit 433 generates a voltage signal (not shown) or a reference voltage Vref, which is used in the memory cell array 410 of the semiconductor memory device 400 or various circuit blocks. For example, the voltage generation unit 433 generates internal voltages used as an operating voltage of various circuit blocks in the semiconductor memory device 400 and generates a reference voltage for the memory cell array 410. At least one of internal voltages generated by the voltage generation unit 433 may be provided to the voltage detection unit 434. For example, the reference voltage Vref may be provided to the voltage detection unit 434.

The voltage detection unit 434 receives an external voltage EVC provided from the external and compares the external voltage EVC with the reference voltage Vref to detect a level of the external voltage EVC. A result obtained by detecting a level of the external voltage EVC is provided as detection signals H1, H2, L1, and L2 to at least one circuit block of the semiconductor memory device 400. A circuit block receives detection signals H1, H2, L1, and L2 and controls operations of a corresponding block in response to the received detection signals H1, H2, L1, and L2. For example, as shown in FIG. 15, the output buffer 426 receives the detection signals H1, H2, L1, and L2. The output buffer 426 controls a delay operation of data or its driver strength to adjust an output speed of data in response to the detection signals H1, H2, L1, and L2. In a similar manner, the detection signals H1, H2, L1, and L2 may be provided to the voltage generation unit 433 for generating an internal voltage. Then, the voltage generation unit 433 generates a voltage by adjusting a level of an internal voltage in response to the detection signals H1, H2, L1, and L2. Or, when the semiconductor memory device 400 includes a plurality of voltage generation units (not shown), the detection signals H1, H2, L1, and L2 may be provided to the plurality of voltage generating units, respectively.

Figure 16:
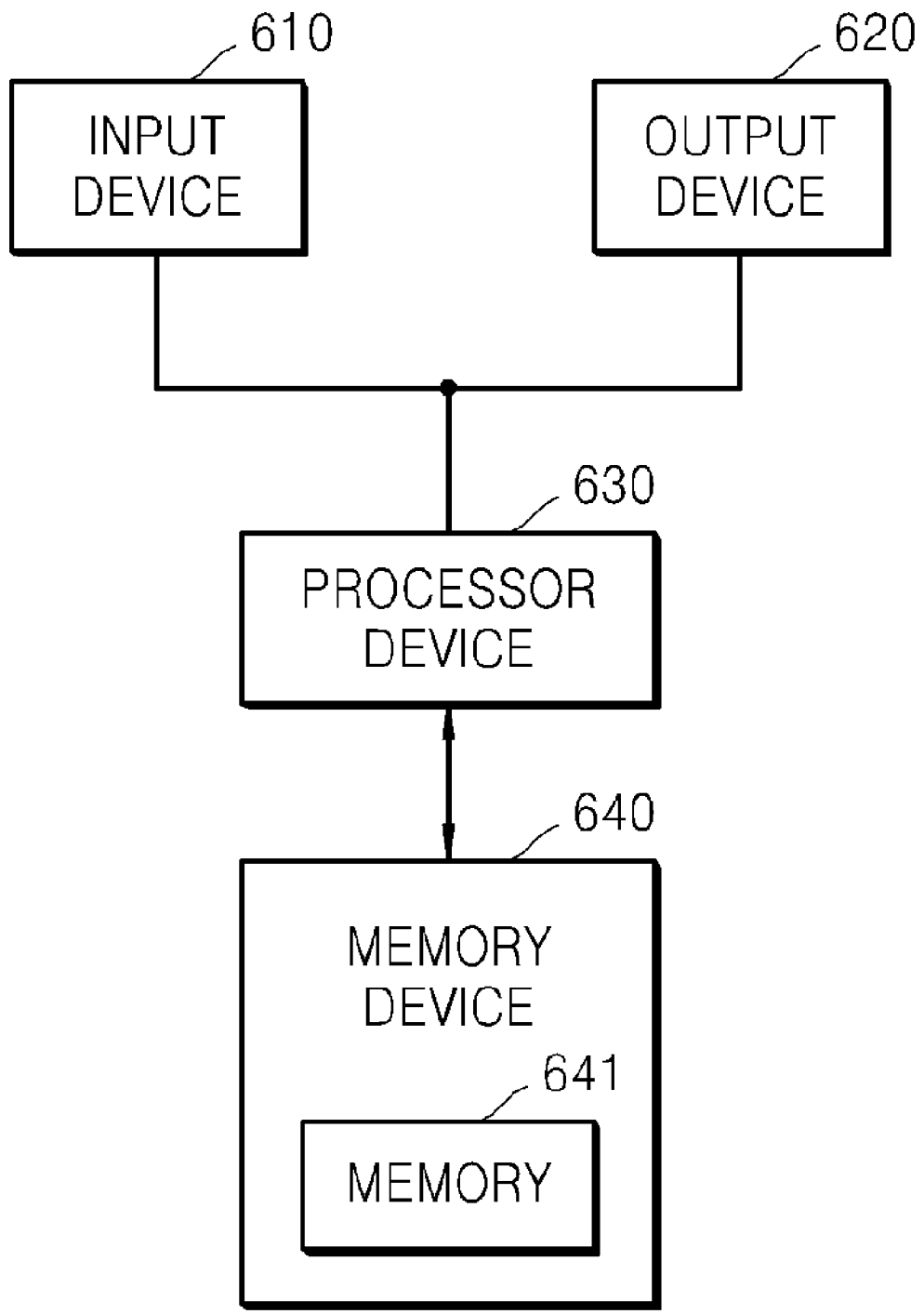
FIG. 16 is a block diagram illustrating an application example of an electronic system including a semiconductor device according to an embodiment.

FIG. 16 is a block diagram illustrating an application example of an electronic system including a semiconductor device according to an exemplary embodiment. Referring to FIG. 16, the electronic system 600 includes an input device 610, an output device 620, a processor device 630, and a semiconductor memory device 640.

The semiconductor memory device 640 may include a voltage detection device (not shown) according to an exemplary embodiment and may adjust a data output speed or control various other functions on the basis of a result obtained by detecting a level of an external voltage of the voltage detection device. The semiconductor memory device 640 includes a memory 641 and a memory controller (not shown) for driving the memory 641. The processor device 630 controls the input device 610, the output device 620, and the semiconductor memory device 640 through each corresponding interface.

Figure 17:
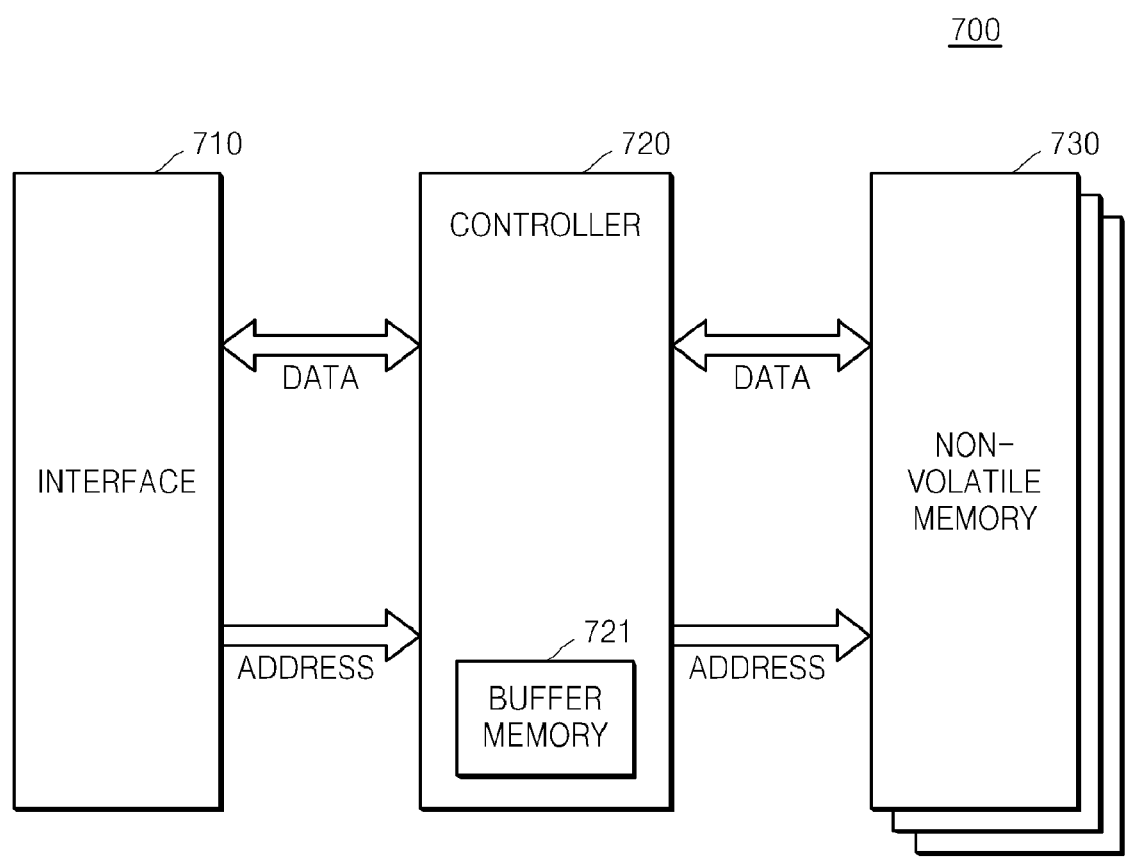
FIG. 17 is a block diagram illustrating an application example of a memory card using a semiconductor device according to an embodiment.

FIG. 17 is a block diagram illustrating an application example of a memory card using a semiconductor device according to an exemplary embodiment. Referring to FIG. 17, the memory card 700 includes an interface unit 710, a controller 720, and a semiconductor memory device such as a non-volatile memory 730. Although the above DDR-SDRAM as a volatile memory device is used for the semiconductor memory device 400 in FIG. 15, a non-volatile memory device is used for the semiconductor memory device 730 as shown in FIG. 17.

The interface unit 710 provides an interface between the memory card 700 and a host. The interface unit 710 includes a data exchange protocol corresponding to the host, in order to interface with the host. The interface unit 710 is configured to communicate with the host through one of various interfaces such as Universal Serial Bus (USB), Multi-Media Card (MMC), Peripheral Component Interconnect-Express (PCI-E), Serial-attached SCSI (SAS), Serial Advanced Technology Attachment (SATA), Parallel Advanced Technology Attachment (PATA), Small Computer System Interface (SCSI), Enhanced Small Disk Interface (ESDI), and Integrated Drive Electronics (IDE).

The controller 720 receives data and an address provided from the external through the interface unit 710. The controller 720 accesses the semiconductor memory device 730 with reference to the data and address provided from a host. The controller 720 may deliver the data read from the semiconductor memory device 730 to the host through the interface unit 710. The controller 720 may include a buffer memory 721.

The buffer memory 721 may temporarily store data to be written, provided from a host, or data read from the semiconductor memory device 730. On the read request of a host, if data in the semiconductor memory device 730 are cached, the buffer memory 721 supports a cache function for directly providing the cached data to the host. Generally, a data transfer rate using a bus format (for example, SATA or SAS) of a host is far faster than that of a memory channel of the memory card. That is, if an interface speed of the host is far higher than that of the memory channel, performance deterioration occurs due to a speed difference. However, this may be minimized by providing the buffer memory 721.

The semiconductor memory device 730 is provided as a storage medium of the memory card 700. For example, the semiconductor memory device 730 may be realized with a resistive memory device. Moreover, the semiconductor memory device 730 may be realized with a NAND-type flash memory of a large storage capacity. The semiconductor memory device 730 may include a plurality of memory devices. In this case, each memory device is connected to the controller 720 by a channel unit. The semiconductor memory device 730 as a storage medium may include PRAM, MRAM, ReRAM, FRAM, and NOR flash memory and also a memory system mixed with different types of memory devices.

Figure 18:
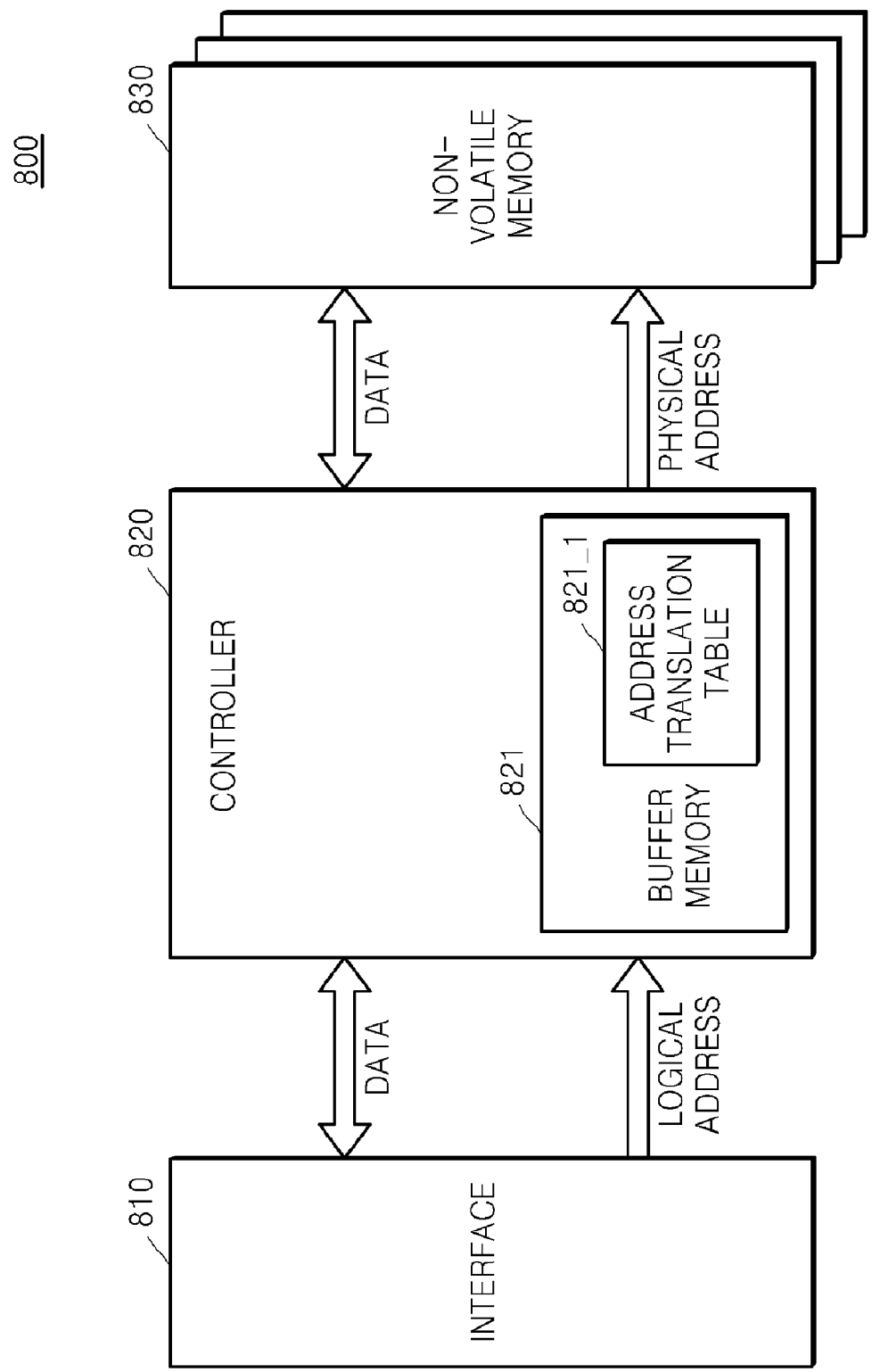
FIG. 18 is a block diagram illustrating another application example of a memory card according to an embodiment.

FIG. 18 is a block diagram illustrating another application example of a memory card according to an exemplary embodiment. Referring to FIG. 18, the memory card 800 includes an interface unit 810, a controller 820, and a semiconductor memory device such as a non-volatile memory 830. Configurations of the interface unit 810 and the semiconductor memory device 830 are substantially identical to those of FIG. 17. Accordingly, they will not be described again.

The controller 820 includes a buffer memory 821 with an address translation table 821_1. The controller 820 translates a logical address provided from the interface unit 810 into a physical address, with reference to the address translation table 821_1. Referring to the translated physical address, the controller 820 accesses the semiconductor memory device 830.

The memory cards 700 and 800 shown in FIGS. 17 and 18 may be mounted in an information processing device such as a digital camera, a Portable Media Player (PMP), a mobile phone, and a notebook computer. The memory cards 700 and 800 may include an MMC card, a Secure Digital (SD) Card, a micro SD card, a Memory Stick, an ID card, a Personal Computer Memory Card International Association (PCM-CIA) card, a Chip Card, a USB card, a Smart Card), and a Compact Flash (CF) Card.

Figure 19:
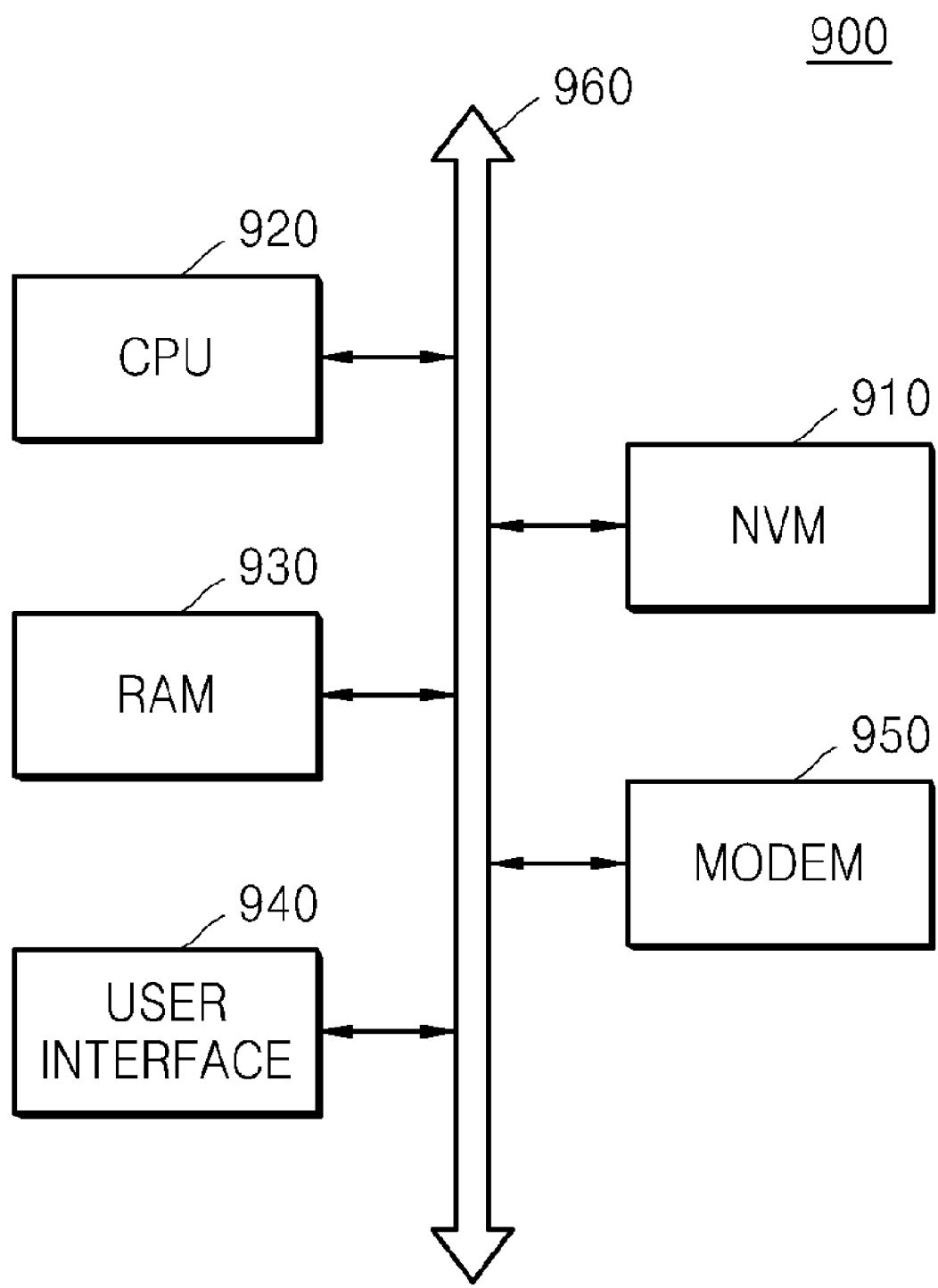
FIG. 19 is a schematic view illustrating a computing system including a memory device or a memory system according to an embodiment.

FIG. 19 is a schematic view illustrating a computing system including a memory device or a memory system according to an exemplary embodiment. The computing system 900 includes a Central Processing Unit (CPU) 920, a RAM 930, a user interface 940, a modem 950 such as a baseband chipset, and a memory system 910, all of which are electrically connected to a system bus 960.

The memory system 910 may include at least one nonvolatile memory device using a first high voltage VPP1 and a second voltage VPP2 from boosters for generating respectively different high voltages. The second high voltage VPP2 generated from one booster may be used as a source voltage, which generates the first high voltage VPP1 higher than the second high voltage VPP2, or a driving voltage.

The memory system 910 or the RAM 930 as a device for storing or outputting data includes various logic circuits for performing data operations. Each of the memory system 910 and the RAM 930 operates by receiving an external voltage and includes a device (not shown) for detecting a level of the external voltage. According to a result obtained by detecting a level of the external voltage, the logic circuits may be controlled for operations. For example, the memory system 910 or the RAM 930 may include an output buffer for reading data stored in a memory and temporarily storing them and may adjust an output speed of data by controlling the output buffer in response to a result obtained by detecting a level of the external voltage.

If the computing system 900 is a mobile device, a battery (not shown) for supplying an operating voltage to the computing system 900 may be additionally provided. Although not shown in the drawings, it is apparent to those of ordinary skill in the art that the computing system 900 may further include an Application chipset, a Camera Image Processor (CIP), and Mobile DRAM. The memory system 910 may include a Solid State Drive/Disk (SSD) using a nonvolatile memory to store data. Or, the memory system 910 may include a fusion flash memory (for example, a combined memory of a SRAM buffer, a NAND flash memory, and a NOR interface logic).

A memory device and/or a controller according to exemplary embodiments may be mounted using various types of packages. For example, a resistive memory device and/or a controller may be mounted through packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), and Wafer-Level Processed Stack Package (WSP).

Although a few exemplary embodiments have been shown and described, it will be understood that various changes in form and details may be made therein without departing from the principles and spirit of the inventive concept, the scope of which is defined in the claims and their equivalents.

What is claimed is:

1. A voltage detection device comprising:
   a first clock generator which generates a first clock signal having a period that changes according to an external voltage;
   a second clock generator which generates a second clock signal having a predetermined period corresponding to a reference voltage; and
   a detector which detects a change of the external voltage by comparing the first clock signal with the second clock signal.

2. The voltage detection device of claim 1, wherein the detector comprises:
   a counter controlled to be tuned on or off in response to the first clock signal and generating a counting signal by counting the second clock signal; and
   a comparator comparing the counting signal with a reference value.

3. The voltage detection device of claim 2, wherein the comparator outputs as a comparison result a plurality of bits having different values according to a difference between a value of the counting signal and the reference value.

4. The voltage detection device of claim 2, wherein the reference value is a value corresponding to the counting signal when the external voltage is at a first level; and when the external voltage is less than the first level, a period of the first clock signal is increased and the counting signal has a value exceeding the reference value.

5. The voltage detection device of claim 2, wherein the reference value is a value corresponding to the counting signal when the external voltage is in a first level; and when the external voltage is greater than the first level, a period of the first clock signal is decreased and the counting signal has a value less than the reference value.

6. The voltage detection device of claim 1, further comprising a frequency divider which divides the first and second clock signals respectively.

7. The voltage detection device of claim 1, wherein each of the first clock signal and the second clock signal is a differential signal, and further comprising a signal converter which converts the first clock signal and the second clock signal into a single signal respectively.

8. A semiconductor device comprising:
a first clock generator which generates a first clock signal having a period that changes according to an external voltage;
a second clock generator which generates a second clock signal having a predetermined period corresponding to a reference voltage;
a detector which detects a change of the external voltage by comparing the first clock signal with the second clock signal; and
an output driver in which a driver strength is adjusted according to a detection result of the detector.

9. The semiconductor device of claim 8, wherein the output driver comprises:
a plurality of Metal Oxide Semiconductor (MOS) transistors disposed in parallel to output internal data; and
an enable control unit disposed in correspondence to at least one of the plurality of MOS transistors and which enables the MOS transistor in response to the detection result.

10. The semiconductor device of claim 8, wherein the output driver comprises:
a plurality of MOS transistors disposed in parallel to output internal data; and
a delay control unit which controls delays of internal data provided from the MOS transistor in response to the detection result.

11. The semiconductor device of claim 8, wherein the detector comprises:
a counter which is controlled to be tuned on or off in response to the first clock signal and which generates a counting signal by counting the second clock signal; and
a comparator which compares the counting signal with a reference value.

12. The semiconductor device of claim 11, wherein the comparator outputs as a comparison result a plurality of bits having different values according to a difference between a value of the counting signal and the reference value.

13. The semiconductor device of claim 11, wherein the reference value is a value corresponding to the counting signal when the external voltage is in a first level; and when the external voltage is less than the first level, a period of the first clock signal is increased, the counting signal exceeds the reference value, and a driver strength of the output driver is increased.

14. The semiconductor device of claim 11, wherein the reference value is a value corresponding to the counting signal when the external voltage is at a first level; and when the external voltage is greater than the first level, a period of the first clock signal is decreased, the counting signal has a value less than the reference value, and a driver strength of the output driver is decreased.

15. The semiconductor device of claim 8, wherein each of the first and second clock signals is a differential signal, and further comprising a signal converter which converts the first clock signal and the second clock signal into a single signal respectively.

16. A voltage detection method comprising:
generating a first clock signal having a frequency that changes according to an external voltage and generating a second clock signal having a predetermined frequency corresponding to a reference voltage;
comparing the frequency of the first clock signal with the predetermined frequency of the second clock signal; and
detecting a change of the external voltage according to a comparison result.

17. The voltage detection method according to claim 16, further comprising generating a first detection signal and a second detection signal according to the detected change of the external voltage, wherein if detected that a level of the external voltage is greater than a predetermined level, an output speed of data is controlled to be reduced in response to the first and second detection signals.

18. The voltage detection method according to claim 16, further comprising generating a first detection signal and a second detection signal according to the detected change of the external voltage, wherein if detected that a level of the external voltage is less than a predetermined level, an output speed of data is controlled to be increased in response to the first and second detection signals.

* * * * *